(12) United States Patent
Gu et al.

(10) Patent No.: US 9,853,446 B2
(45) Date of Patent: Dec. 26, 2017

(54) INTEGRATED CIRCUIT (IC) PACKAGE COMPRISING ELECTROSTATIC DISCHARGE (ESD) PROTECTION

(71) Applicant: QUALCOMM Incorporated, San Diego, CA (US)

(72) Inventors: Shiqun Gu, San Diego, CA (US); Eugene Robert Worley, Irvine, CA (US); Ratibor Radojcic, San Diego, CA (US); Urmi Ray, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 244 days.

(21) Appl. No.: 14/838,034

(22) Filed: Aug. 27, 2015

(65) Prior Publication Data
US 2017/0063079 A1   Mar. 2, 2017

(51) Int. Cl.
| | | |
|---|---|---|
| *H02H 9/04* | (2006.01) | |
| *H01L 23/48* | (2006.01) | |
| *H01L 23/60* | (2006.01) | |
| *H01L 23/62* | (2006.01) | |
| *H01L 27/02* | (2006.01) | |

(52) U.S. Cl.
CPC ............ *H02H 9/046* (2013.01); *H01L 23/48* (2013.01); *H01L 23/60* (2013.01); *H01L 23/62* (2013.01); *H01L 27/0255* (2013.01); *H01L 27/0292* (2013.01); *H01L 27/0296* (2013.01); *H02H 9/044* (2013.01); *H01L 2224/16225* (2013.01); *H01L 2924/15311* (2013.01); *H01L 2924/181* (2013.01)

(58) Field of Classification Search
CPC ..................................................... H02H 9/046
See application file for complete search history.

(56) References Cited

U.S. PATENT DOCUMENTS

| | | | | |
|---|---|---|---|---|
| 7,872,346 B1 * | 1/2011 | Chee | ...................... | H01L 23/585 257/678 |
| 8,587,071 B2 * | 11/2013 | Tsai | ..................... | H01L 27/0259 257/139 |

(Continued)

OTHER PUBLICATIONS

International Search Report and Written Opinion—PCT/US2016/049123—ISA/EPO—dated Nov. 25, 2016.

*Primary Examiner* — Scott Bauer
(74) *Attorney, Agent, or Firm* — Loza & Loza, LLP/Qualcomm

(57) ABSTRACT

An intergrated circuit (IC) package includes a die, a package substrate coupled to the die, and a first electrostatic discharge (ESD) protection component coupled to the package substrate, where the first electrostatic discharge (ESD) protection component is configured to provide package level electrostatic discharge (ESD) protection. In some implementations, the first electrostatic discharge (ESD) protection component is embedded in the package substrate. In some implementations, the die includes an internal electrostatic discharge (ESD) protection component configured to provide die level electrostatic discharge (ESD) protection. In some implementations, the internal electrostatic discharge (ESD) protection component and the first electrostatic discharge (ESD) protection component are configured to provide cumulative electrostatic discharge (ESD) protection for the die.

23 Claims, 15 Drawing Sheets

(56) References Cited

U.S. PATENT DOCUMENTS

| | | |
|---|---|---|
| 2007/0066897 A1 | 3/2007 | Sekins et al. |
| 2012/0200965 A1* | 8/2012 | Furutani ................ H01L 23/60 |
| | | 361/56 |
| 2013/0063843 A1 | 3/2013 | Chen et al. |
| 2013/0334695 A1 | 12/2013 | Tijssen et al. |
| 2014/0071566 A1 | 3/2014 | Parthasarathy et al. |
| 2014/0167101 A1 | 6/2014 | Bobde et al. |
| 2014/0210097 A1 | 7/2014 | Chen et al. |
| 2014/0284754 A1 | 9/2014 | Yamamoto |
| 2015/0061084 A1 | 3/2015 | Tsai et al. |

* cited by examiner

ELECTROSTATIC DISCHARGE (ESD) PROTECTION COMPONENT

INTEGRATED CIRCUIT (IC) PACKAGE COMPRISING ELECTROSTATIC DISCHARGE (ESD) PROTECTION

BACKGROUND

Field

Various features relate to an integrated circuit (IC) package, and more specifically to an integrated circuit (IC) package that includes electrostatic discharge (ESD) protection.

Background

FIG. 1 illustrates a configuration of an integrated circuit package that includes a die. Specifically, FIG. 1 illustrates an integrated circuit package 100 that includes a die 102 and a package substrate 106. The package substrate 106 includes a dielectric layer and a plurality of interconnects 110. The package substrate 106 is a laminated substrate. The plurality of interconnects 110 includes traces, pads and/or vias. The die 102 is coupled to the package substrate 106 through a plurality of solder balls 112. The package substrate 106 is coupled to a printed circuit board (PCB) 108 through a plurality of solder balls 116.

The integrated circuit package 100 is designed to operate under a particular package operation. For example, the integrated circuit package 100 is designed to operate within certain reliability requirements and electronic stress boundaries. Examples of electronic stress boundaries include voltage boundaries (e.g. change in voltages), current boundaries (e.g., change in currents), and electrostatic discharge (ESD) boundaries. Similarly, the die 102 is designed to operate within similar electronic stress boundaries. These electronic stress boundaries are tested at the package level. That is, the integrated circuit package 100 is tested by an electronic tester (e.g., ESD tester) to determine whether the integrated circuit package 100, as a whole, is within specified electronic stress boundaries.

Different devices (e.g., mobile devices, automotive devices) may specify different package operations, different reliability, and different electronic stress boundaries (e.g., different ESD requirements). Thus, different circuit designs for the dies and packages are desirable for different devices due to the different reliability and different electronic stress boundary specifications for each device. However, the process of redesigning the circuit design of the die 102 can be quite expensive. In many cases, this cost is so high that it is prohibitive.

Moreover, changes to the circuit design of the die 102 will result in changes to the overall electronic reliability and sensitivity of the integrated circuit package 100. For example, changes to the circuit design of the die 102 may result in a different electronic stress boundary of the die 102 and a different electronic stress boundary of the integrated circuit package 100. Thus, a redesign of the circuit design of the die 102 may require a substantial redesign of the integrated circuit package 100. In a worst case scenario, a new circuit design of the die 102 may not work at all with the pre-existing design of the integrated circuit package 100.

Therefore, there is a need for an integrated circuit package that can be used with different devices, applications, reliability requirements and electronic stress boundaries without having to completely redesign the die, while at the same time meeting the needs and/or requirements of the devices in which the integrated circuit package is implemented in.

SUMMARY

Various features relate to an integrated circuit (IC) package that includes electrostatic discharge (ESD) protection.

One example provides an integrated circuit (IC) package that includes a die, a package substrate coupled to the die, and a first electrostatic discharge (ESD) protection component coupled to the package substrate, where the first electrostatic discharge (ESD) protection component is configured to provide package level electrostatic discharge (ESD) protection.

Another example provides an electronic device that includes an integrated circuit (IC) package comprising a die and a package substrate coupled to the die. The electronic device also includes an interposer coupled to the integrated circuit (IC) package, where the interposer comprises a first electrostatic discharge (ESD) protection component. The first electrostatic discharge (ESD) protection component is configured to provide electrostatic discharge (ESD) protection.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device package (e.g., integrated circuit (IC) package) that includes a die, a package substrate coupled to the die, and a first electrostatic discharge (ESD) protection component coupled to the package substrate. The first electrostatic discharge (ESD) protection component is configured to provide package level electrostatic discharge (ESD) protection. In some implementations, the first electrostatic discharge (ESD) protection component is embedded in the package substrate. In some implementations, the die includes an internal electrostatic discharge (ESD) protection component that is configured to provide die level electrostatic discharge (ESD) protection. In some implementations, the internal electrostatic discharge (ESD) protection component and the first electrostatic discharge (ESD) protection component are configured to provide cumulative electrostatic discharge (ESD) protection for some or all of the input/output (I/O) terminals of the die.

Figure 1:
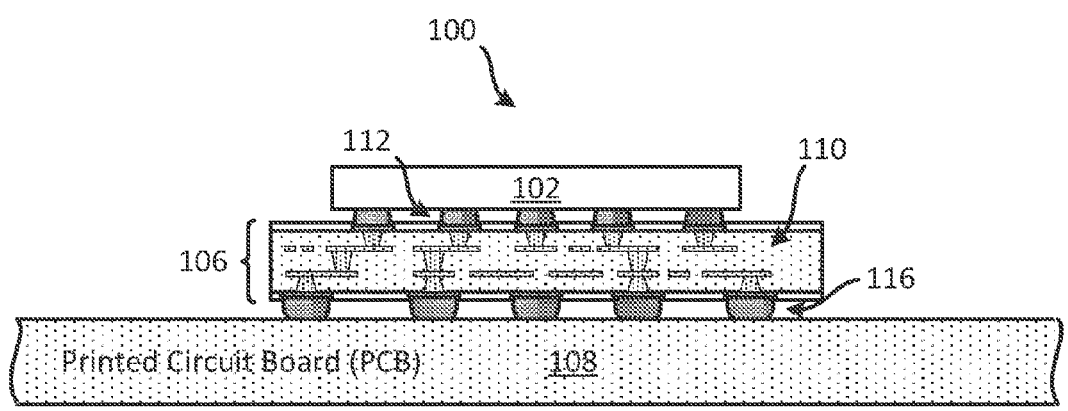
FIG. 1 illustrates an integrated circuit (IC) package.
Figure 2:
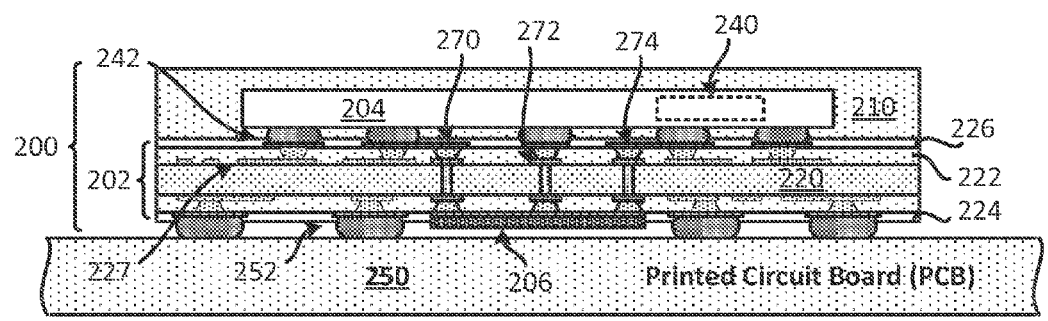
FIG. 2 illustrates a profile view of an example of an integrated circuit package that includes an electrostatic discharge (ESD) protection component.

Exemplary Integrated Circuit (IC) Package Comprising an Electrostatic Discharge (ESD) Protection Component FIG. 2 illustrates an example of a device package that includes an electrostatic discharge (ESD) protection component configured to provide package level electrostatic discharge (ESD) protection. Specifically, FIG. 2 illustrates an example of an integrated circuit (IC) package 200 that includes a substrate 202, a die 204, an electrostatic discharge (ESD) protection component 206, and an encapsulation layer 210. The integrated circuit (IC) package 200 is mounted on a printed circuit board (PCB) 250. The die 204 may be an integrated circuit (IC) that includes several transistors and/or other electronic components. The die 204 may be a logic die and/or a memory die. As will be further described below, the die 204 may include an internal electrostatic discharge (ESP) protection component 240 that is configured to provide die level electrostatic discharge (ESP) protection.

In some implementations, the electrostatic discharge (ESD) protection component 206 (e.g., first electrostatic discharge (ESD) protection component) and/or the internal electrostatic discharge (ESD) protection component 240 (e.g., second electrostatic discharge (ESD) protection component) may be configured to allow the die 204 and the integrated circuit (IC) package 200 to meet at least one electrostatic discharge (ESD) testing model. In some implementations, without the electrostatic discharge (ESD) protection component 206 and/or the internal electrostatic discharge (ESD) protection component 240, the die 204 and the integrated circuit (IC) package 200 may not meet a particular electrostatic discharge (ESD) testing model. Examples of various electrostatic discharge (ESD) testing models are further described below.

The substrate 202 may be a package substrate and/or an interposer. The die 204 is coupled (e.g., mounted) to the substrate 202. More specifically, the die 204 is coupled to the substrate 202 through a first plurality of solder balls 242. In some implementations, the die 204 may be coupled to the substrate 202 differently.

The substrate 202 includes a first dielectric layer 220, a second dielectric layer 222, a third dielectric layer 223, a first solder resist layer 224, a second solder resist layer 226, and several interconnects 227. The first dielectric layer 220 may be a core layer. In some implementations, the first dielectric layer 220 may be a prepeg layer. The second dielectric layer 222 and/or the third dielectric layer 223 may be one or more dielectric layers (e.g., one or more prepeg layers). The interconnects 227 may include traces, pads and/or vias, that are formed in the first dielectric layer 220, the second dielectric layer 222 and/or the third dielectric layer 223. The first solder resist layer 224 is formed on a first surface (e.g., bottom surface, surface facing the PCB 250) of the substrate 202. The second solder resist layer 226 is formed on a second surface (e.g., top surface, surface facing the die 204) of the substrate 202.

The encapsulation layer 210 at least partially encapsulates the die 204. The encapsulation layer 210 may include a mold and/or an epoxy fill.

As shown in FIG. 2, the electrostatic discharge (ESD) protection component 206 is coupled to the substrate 202. More specifically, the electrostatic discharge (ESD) protection component 206 is coupled to a surface (e.g., bottom surface, surface facing the PCB 250) of the substrate 202. It is noted that the electrostatic discharge (ESD) protection component 206 may be coupled to the substrate 202 differently. For example, the electrostatic discharge (ESD) protection component 206 may be located on a different surface (e.g., top surface, surface facing the die 204) of the substrate 202. In some implementations, the electrostatic discharge (ESD) protection component 206 may be located within the encapsulation layer 210. In some implementations, the electrostatic discharge (ESD) protection component 206 may be embedded in the substrate 202. An example of an electrostatic discharge (ESD) protection component that is embedded in a substrate is further described in detail below in at least FIG. 8.

The electrostatic discharge (ESD) protection component 206 provides several technical advantages to the integrated circuit (IC) package 200.

First, the electrostatic discharge (ESD) protection component 206 provides better ESD protection than the internal electrostatic discharge (ESD) protection component 240. This is because the electrostatic discharge (ESD) protection component 206 is much larger than the internal electrostatic discharge (ESD) protection component 240, and is thus able to provide a more robust, reliable and/or powerful ESD protection. The internal electrostatic discharge (ESD) protection component 240, if included in the die 204, is limited by the size of the die 204 and is thus only able to provide limited ESD protection.

Second, the electrostatic discharge (ESD) protection component 206 is easier to design as a separate component instead of being integrated in the die 204. The die 204 has many transistor devices and integrating an electrostatic discharge (ESD) protection component in the die 204 requires a more complex manufacturing process than the manufacturing process of a separate electrostatic discharge (ESD) protection component 206.

Third, since the electrostatic discharge (ESD) protection component 206 is a separate electronic component, the die 204 does not need to be redesigned. Instead, the electrostatic discharge (ESD) protection component 206 can be designed separately from the die 204 based on an expected and/or anticipated application (e.g., mobile application, automotive application). Thus, even though the die 204 and the integrated circuit (IC) package 200 are configured to operate under a particular application (e.g., mobile application) and pass a particular testing model (e.g., first testing model), the electrostatic discharge (ESD) protection component 206 is configured to allow the die 204 and the integrated circuit (IC) package 200 to operate when the integrated circuit (IC) package 200 operates under another application (e.g., automotive application) and pass another particular testing model (e.g., second testing model) that is different than the particular testing model. For example, the die 204 may be configured to operate in a mobile device, but with the use of the electrostatic discharge (ESD) protection component 206, the die 204 and the integrated circuit (IC) package 200 may be implemented with an electronic device in an automotive vehicle (which has higher voltage and/or higher current specifications/requirements), without having to completely redesign the die 204.

In some implementations, the electrostatic discharge (ESD) protection component 206 is coupled (e.g., directly coupled, indirectly coupled) to at least one input/output (I/O) terminal of the die 204. In some implementations, all of the input/output (I/O) terminals of the die 204 are coupled (e.g., directly coupled, indirectly coupled) to the electrostatic discharge (ESD) protection component 206. Thus, in some implementations, at least some or all of the input/output (I/O) terminals of the die 204 are protected by the electrostatic discharge (ESD) protection component 206.

FIG. 2 illustrates a first plurality of interconnects 270, a second plurality of interconnects 272, and a third plurality of interconnects 274 that are coupled to the electrostatic discharge (ESD) protection component 206. The electrostatic discharge (ESD) protection component 206 is configured to provide package level electrostatic discharge (ESD) protection.

The first plurality of interconnects 270 are located in/on the substrate 202. The first plurality of interconnects 270 may include traces, vias, pads, bumps and/or solder interconnects. The first plurality of interconnects 270 may be configured to provide an electrical path for a first input/output (I/O) signal to and from the die 204. The second plurality of interconnects 272 are located in/on the substrate 202. The second plurality of interconnects 272 may include traces, vias, pads, bumps and/or solder interconnects. The second plurality of interconnects 272 may be configured to provide an electrical path for a power signal (e.g., Vdd) to the die 204. The third plurality of interconnects 274 are located in/on the substrate 202. The third plurality of interconnects 274 may include traces, vias, pads, bumps and/or solder interconnects. The third plurality of interconnects 274 may be configured to provide an electrical path for a ground reference signal (e.g., Vss) from the die 204. The first plurality of interconnects 270, the second plurality of interconnects 272 and/or the third plurality of interconnects 272 may be coupled to the die 204 (e.g., through the first plurality of solder balls 242). Different implementations may have a different number of interconnects coupled to the electrostatic discharge (ESD) protection component 206.

As mentioned above, FIG. 2 further illustrates that the integrated circuit (IC) package 200 is coupled (e.g., mounted) on the printed circuit board (PCB) 250 through a second plurality of solder balls 252. More specifically, the substrate 202 of the integrated circuit (IC) package 200 is coupled to the PCB 250 through the second plurality of solder balls 252. In some implementations, the integrated circuit (IC) package 200 may be coupled to the PCB 250 differently.

In some implementations, the several electrostatic discharge (ESD) protection components (e.g., internal electrostatic discharge (ESD) protection component 240 of the die and the electrostatic discharge (ESD) protection component 206 of the package substrate) may provide cumulative electrostatic discharge (ESD) protection for the die 204 and the integrated circuit (IC) package 200. Cumulative electrostatic discharge (ESD) protection is further described in detail below in FIGS. 7 and 10. The electrostatic discharge (ESD) protection component 206 may provide package level electrostatic discharge (ESD) protection (e.g., protection of the die 204 and other components in the integrated circuit (IC) package 200). In some implementations, providing the electrostatic discharge (ESD) protection component 206 inside the integrated circuit (IC) package 200 may provide real estate savings in the device, since the electrostatic discharge (ESD) protection component 206 may be provided in the available space of the integrated circuit (IC) package 200.

In some implementations, the die 204 is configured to operate at a first voltage provided to the integrated circuit (IC) package 200, and an electrostatic discharge (ESD) protection component (e.g., electrostatic discharge (ESD) protection components 206, 240, 906) allows the die 204 to operate when the integrated circuit (IC) package 200 is coupled to a power source that provides a second discharge voltage to the integrated circuit (IC) package 200.

FIG. 2 illustrates that the electrostatic discharge (ESD) protection component 206 is positioned and located underneath the substrate 202. However, the electrostatic discharge (ESD) protection component 206 may be positioned and located differently in or on the integrated circuit (IC) package 200. For example, the electrostatic discharge (ESD) protection component 206 may be located over the substrate 202 and co-planar with the die 204. In some implementations, the electrostatic discharge (ESD) protection component 206 may be at least partially encapsulated by the encapsulation layer 210. In some implementations, the electrostatic discharge (ESD) protection component 206 may be embedded in the substrate 202, which is further described below in FIG. 8.

Exemplary Electrostatic Discharge Protection (ESD) Components

Different implementations may use different designs of an electrostatic discharge (ESD) protection component. FIGS. 3-6 illustrate various examples of an electrostatic discharge (ESD) protection component.

Figure 3:
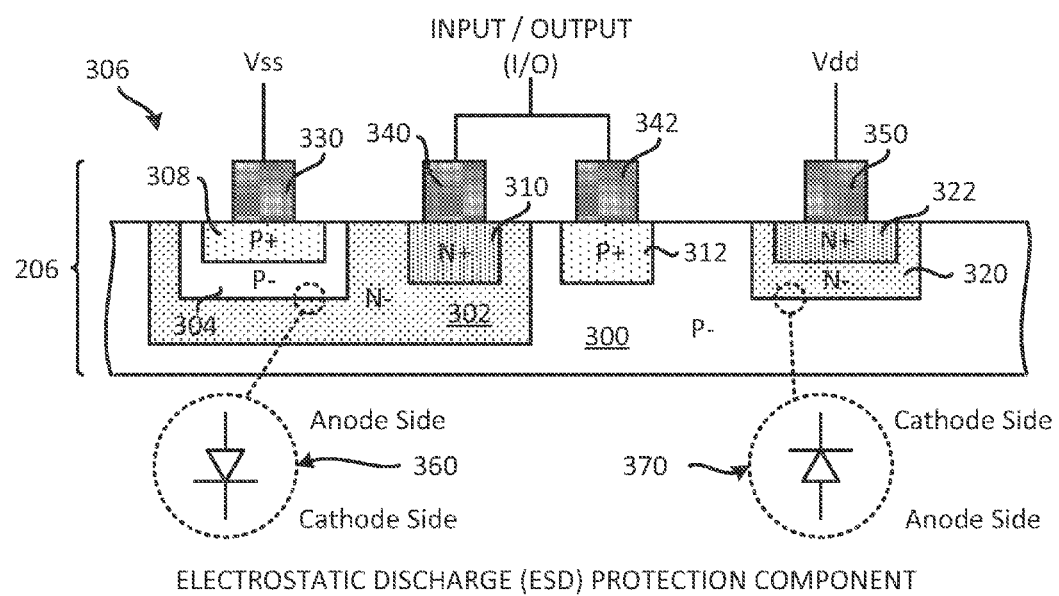
FIG. 3 illustrates a profile view of an example of an electrostatic discharge (ESD) protection component.

FIG. 3 illustrates a profile view of an example of an electrostatic discharge (ESD) protection component configuration 306 that may be implemented with a device package (e.g., integrated circuit (IC) package). In some implementations, the electrostatic discharge (ESD) protection component configuration 306 may be implemented as the electrostatic discharge (ESD) protection component 206 described in FIG. 2. The electrostatic discharge (ESD) protection component configuration 306 may be configured as a semiconductor device.

As shown in FIG. 3, the electrostatic discharge (ESD) protection component 206 includes the electrostatic discharge (ESD) protection component configuration 306. The electrostatic discharge (ESD) protection component configuration 306 includes a first P− (light P doped) layer 300, a first N− (light N doped) layer 302, a second P− layer 304, a first P+ (heavily P doped) layer 308, a first N+ (heavily N doped) layer 310, a second P+ layer 312, a second N− layer 320, a second N+ layer 322, a first contact interconnect 330, a second contact interconnect 340, a third contact interconnect 342, and a fourth contact interconnect 350.

The first N− layer 302, the second P+ layer 312, and the second N− layer 320 are located in the a first P− layer 300. The second P− layer 304 and the first N+ layer 310 are located in the first N− layer 302. The first P+ layer 308 is located in the second P− layer 304. The second N+ layer 322 is located in the second N− layer 320.

The second P− layer 304 at least partially encapsulates the first P+ layer 308. The first N− layer 302 at least partially encapsulates the second P− layer 304 and the first N+ layer 310. The second N− layer 320 at least partially encapsulates the second N+ layer 322. The first P− layer 300 at least partially encapsulates the first N− layer 302, the second P+ layer 312 and the second N− layer 320.

The first contact interconnect 330 is coupled to the first P+ layer 308. The first contact interconnect 330 may be configured to provide an electrical path for a ground reference signal (Vss). The second contact interconnect 340 is coupled to the first N+ layer 310. The third contact interconnect 342 is coupled to the second P+ layer 312. The second contact interconnect 340 and the third contact interconnect 342 are configured to provide an electrical path for an input/output (I/O) signal. The fourth contact interconnect 350 is coupled to the second N+ layer 322. The fourth contact interconnect 350 may be configured to provide an electrical path for a power signal (Vdd).

The first contact interconnect 330 may be coupled to the first plurality of interconnects 270 (e.g., through micro bumps and/or solder interconnect). The second contact interconnect 340 and the third contact interconnect 342 may be coupled to the second plurality of interconnects 272 (e.g., through traces, pads, micro bumps and/or solder interconnect). The fourth contact interconnect 350 may be coupled to the third plurality of interconnects 274 (e.g., through micro bumps and/or solder interconnect).

In some implementations, the first N− layer 302 and the second P− layer 304 are configured to operate as a first diode 360, where the first N− layer 302 is a cathode side of the first diode 360, and the second P− layer 304 is an anode side of the first diode 360.

In some implementations, the first P− layer 300 and the second N− layer 320 are configured to operate as a second diode 370, where the first P− layer 300 is an anode side of the second diode 370, and the second N− layer 320 is a cathode side of the second diode 370.

It is noted that different implementations may have different configurations of the various P−, P+, N− and N+ layers, and thus, the configuration shown in FIG. 3 is merely exemplary.

Figure 4:
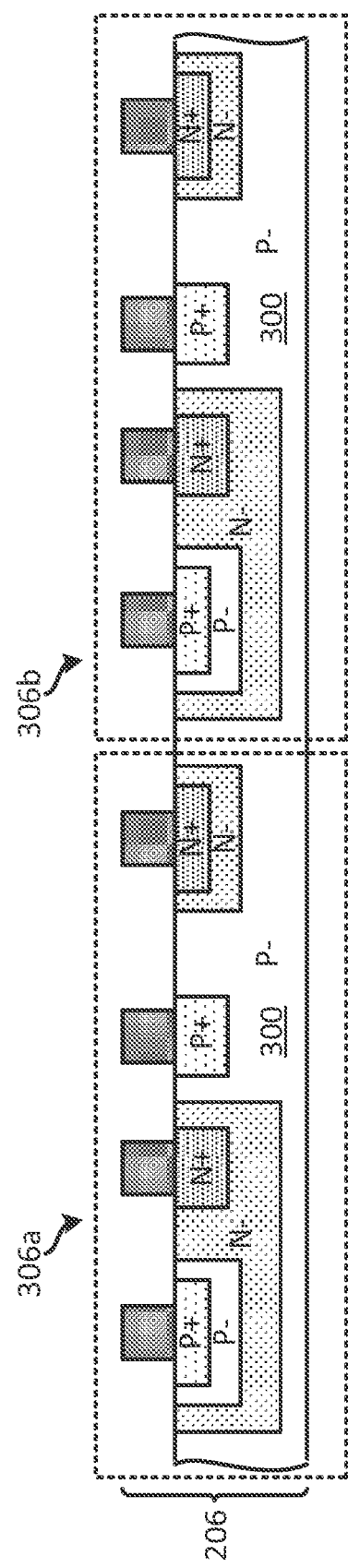
FIG. 4 illustrates a profile view of an example of an electrostatic discharge (ESD) protection component.

FIG. 4 illustrates a profile view of another electrostatic discharge (ESD) protection component. As shown in FIG. 4, the electrostatic discharge (ESD) protection component 206 includes at least two electrostatic discharge (ESD) protection component configurations 306a-b. Thus, FIG. 4 illustrates that the electrostatic discharge (ESD) protection component 206 includes a plurality (e.g., array) of electrostatic discharge (ESD) protection component configurations 306a-b. As further shown in FIG. 4, the various electrostatic discharge (ESD) protection component configurations 306a-b share the first P− (light P doped) layer 300. In some implementations, there may be one electrostatic discharge (ESD) protection component configuration 306 for each input/output (I/O) terminal of the die 204.

Figure 5:
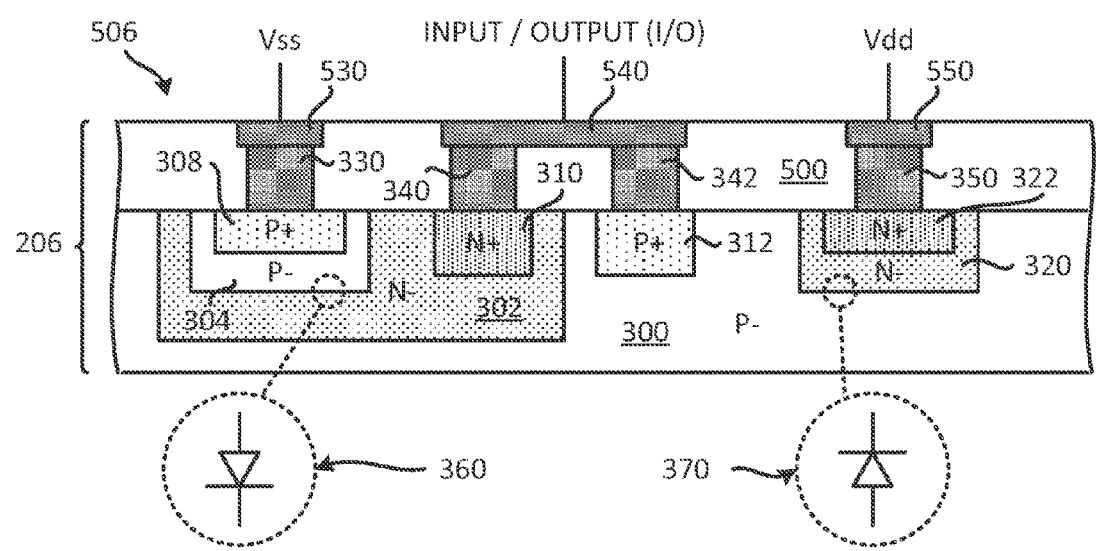
FIG. 5 illustrates a profile view of an example of another electrostatic discharge (ESD) protection component.

FIG. 5 illustrates a profile view of an example of another electrostatic discharge (ESD) protection component configuration 506 that may be implemented with a device package (e.g., integrated circuit (IC) package). In some implementations, the electrostatic discharge (ESD) protection component configuration 506 may be implemented as the electrostatic discharge (ESD) protection component 206 described in FIG. 2. The electrostatic discharge (ESD) protection component configuration 506 may be configured as a semiconductor device.

The electrostatic discharge (ESD) protection component configuration 506 is similar to the electrostatic discharge (ESD) protection component configuration 306 of FIG. 3, except that the electrostatic discharge (ESD) protection component configuration 506 also includes a dielectric layer 500, a first interconnect 530, a second interconnect 540, and a third interconnect 550.

The first interconnect 530 is coupled to the first contact interconnect 330. The second interconnect 540 is coupled to the second contact interconnect 340 and the third contact interconnect 342. The third interconnect 550 is coupled to the fourth contact interconnect 350. The first interconnect 530 may be configured to provide an electrical path for a ground reference signal (Vss). The second interconnect 540 may be configured to provide an electrical path for an input/output (I/O) signal. The third interconnect 550 may be configured to provide an electrical path for a power signal (Vdd). The first interconnect 530 may be coupled to the first plurality of interconnects 270 (e.g., through micro bumps and/or solder interconnect). The second interconnect 540 may be coupled to the second plurality of interconnects 272 (e.g., through micro bumps and/or solder interconnect). The third interconnect 550 may be coupled to the third plurality of interconnects 274 (e.g., through micro bumps and/or solder interconnect).

Similar to FIG. 4, the electrostatic discharge (ESD) protection component 206 of FIG. 5 may include one or more (e.g., plurality) of the electrostatic discharge (ESD) protection component configuration 506.

Figure 6:
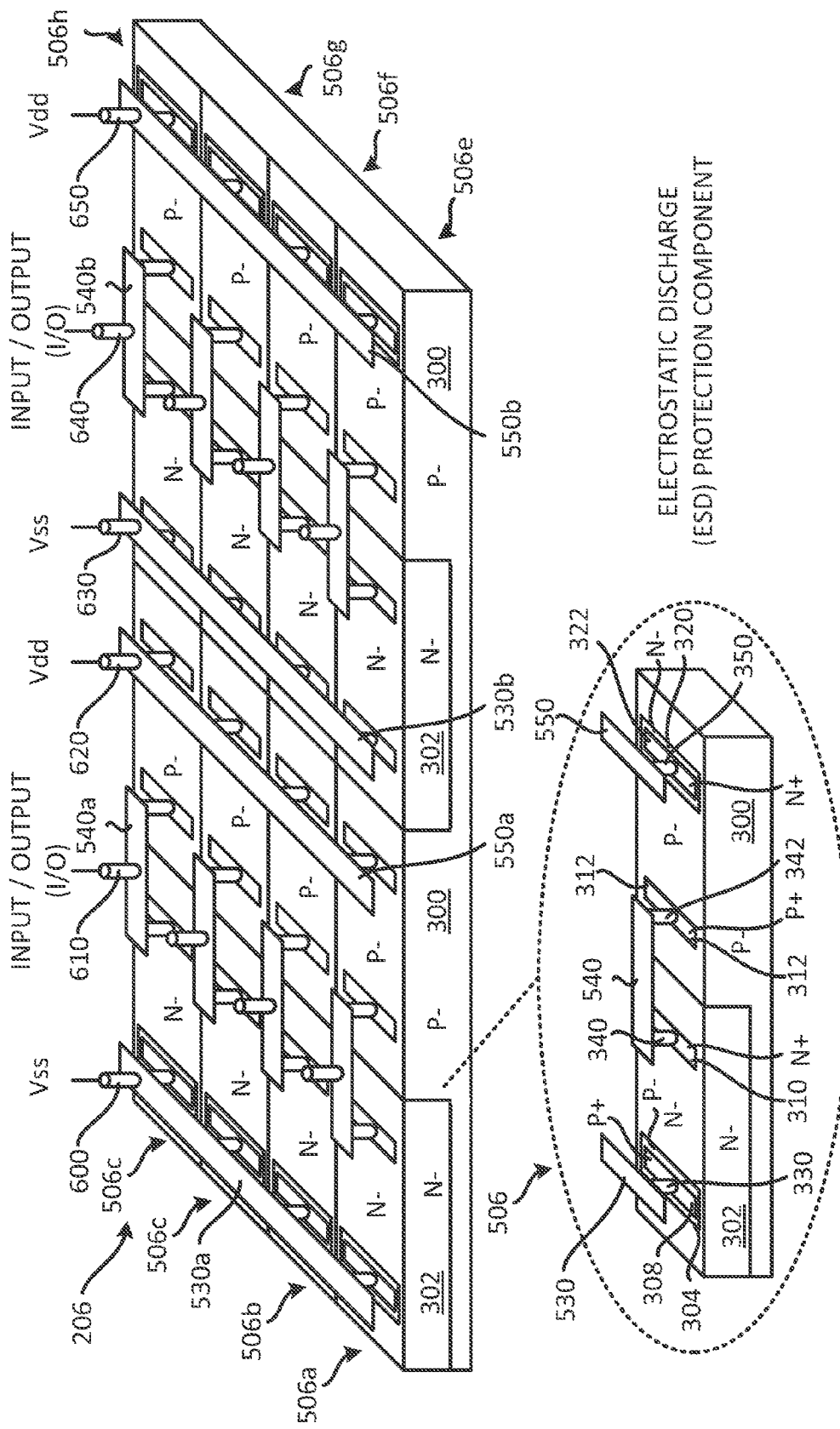
FIG. 6 illustrates a view of an example of an electrostatic discharge (ESD) protection component.

FIG. 6 illustrates a view of an example of another electrostatic discharge (ESD) protection component. As shown in FIG. 6, the electrostatic discharge (ESD) protection component 206 includes a plurality of electrostatic discharge (ESD) protection component configurations 506 (e.g., 506a-h) arranged in an array. It is noted that the electrostatic discharge (ESD) protection component 206 of FIG. 6 may represent a plurality of electrostatic discharge (ESD) protection component configurations 306 (e.g., 306a-b or more). It is also noted that for the purpose of clarity, not all the components of the electrostatic discharge (ESD) protection component 206 are shown in FIG. 6. The electrostatic discharge (ESD) protection component 206 of FIG. 6 may be configured as a semiconductor device.

FIG. 6 illustrates an example of how the various electrostatic discharge (ESD) protection component configurations 506 (e.g., 506a-h) may be electrically coupled together in the electrostatic discharge (ESD) protection component 206. More specifically, FIG. 6 illustrates how some of the electrostatic discharge (ESD) protection component configurations 506 may share one or more paths (e.g., one or more electrical paths) for ground reference signals (e.g., Vss) and power signals (e.g., Vdd). As shown in FIG. 6, the first interconnect 530a is coupled to the first contact interconnect 330 of various electrostatic discharge (ESD) protection component configurations 506. Similarly, the third interconnect 550a is coupled to the fourth contact interconnect 350 of various electrostatic discharge (ESD) protection component configurations 506.

The first interconnect 530a may be coupled to a first interconnect 600 that is configured to provide an electrical path for a ground reference signal (e.g., Vss). The first interconnect 600 may comprise a via and/or solder interconnect of the substrate 202. The second interconnect 540a may be coupled to a second interconnect 610 that is configured to provide an electrical path for an input/output (I/O) signal. The second interconnect 610 may comprise a via and/or solder interconnect of the substrate 202. The third interconnect 550a may be coupled to a third interconnect 620 that is configured to provide an electrical path for a power signal (e.g., Vdd). The third interconnect 620 may comprise a via and/or solder interconnect of the substrate 202.

FIG. 6 further illustrates that the first interconnect 530b is coupled to the first contact interconnect 330 of various other electrostatic discharge (ESD) protection component configurations 506 (e.g., 506e-h). Similarly, the third interconnect 550b is coupled to the fourth contact interconnect 350 of various other electrostatic discharge (ESD) protection component configurations 506 (e.g., 506e-h).

The first interconnect 530b may be coupled to a first interconnect 630 that is configured to provide an electrical path for a ground reference signal (e.g., Vss). The first interconnect 630 may comprise a via and/or solder interconnect of the substrate 202. The second interconnect 540b may be coupled to a second interconnect 640 that is configured to provide an electrical path for an input/output (I/O) signal. The second interconnect 640 may comprise a via and/or solder interconnect of the substrate 202. The third interconnect 550b may be coupled to a third interconnect 650 that is configured to provide an electrical path for a power signal (e.g., Vdd). The third interconnect 650 may comprise a via and/or solder interconnect of the substrate 202.

Examples of how diodes may be configured, arranged and/or electrically coupled to provide electrostatic discharge (ESD) protection in the integrated circuit (IC) package 200 and the die 204 are further illustrated and described below in at least FIGS. 7 and 10.

Figure 7:
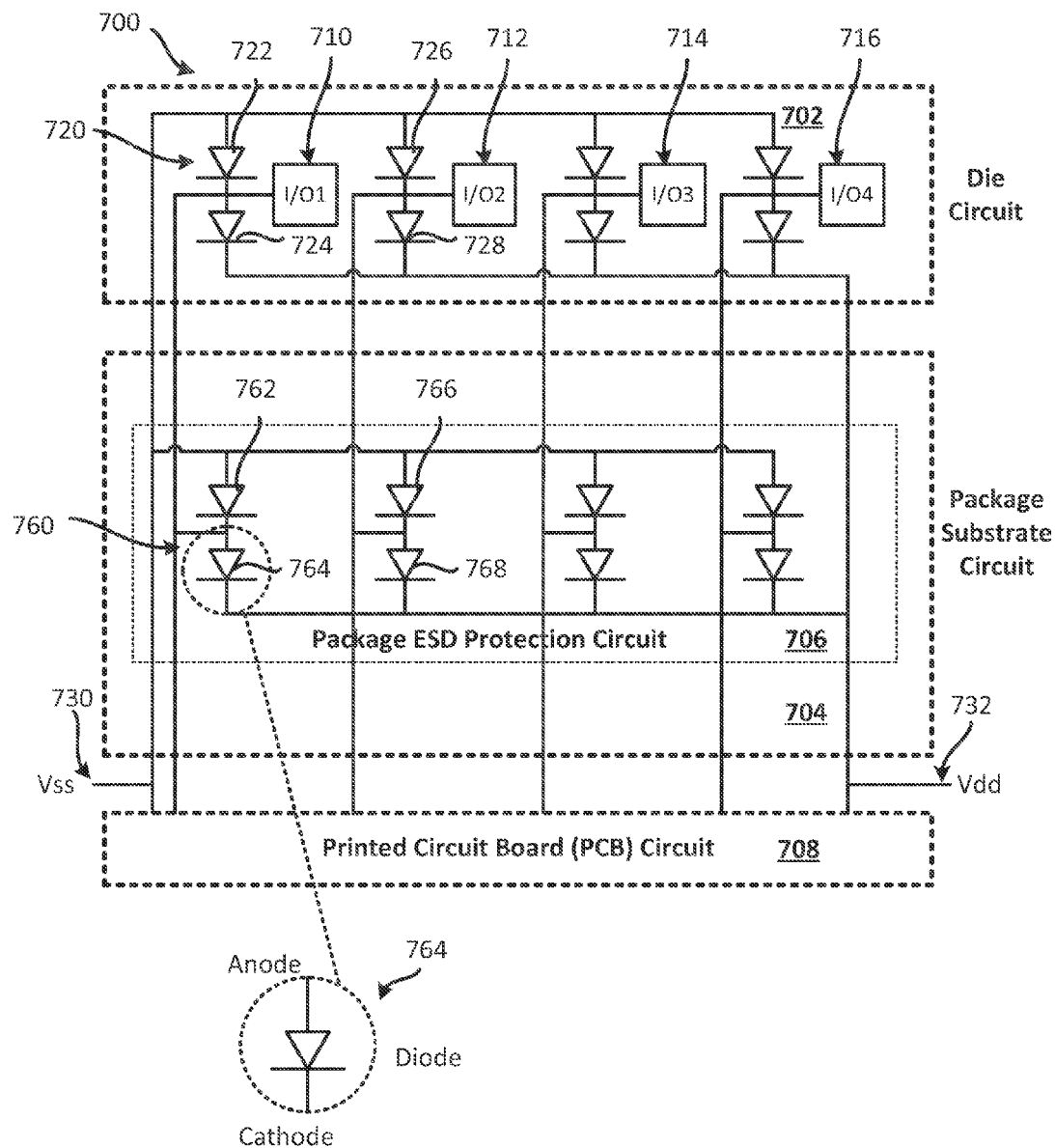
FIG. 7 illustrates an example of circuit diagram of a circuit in an integrated circuit package that includes an electrostatic discharge (ESD) protection component.

Exemplary Circuit Diagram of an Integrated Circuit (IC) Package Comprising an Electrostatic Discharge (ESD) Protection Component FIG. 7 illustrates an exemplary circuit diagram 700 that includes several diodes configured to provide electrostatic discharge (ESD) protection in an integrated circuit (IC) package (e.g., device package). The circuit diagram 700 includes a die circuit 702, a package substrate circuit 704, and an electrostatic discharge (ESD) protection circuit 706. The electrostatic discharge (ESD) protection circuit 706 may be part of the package substrate circuit 704. The die circuit 702 may represent at least part of a circuit for the die 204. The package substrate circuit 704 may represent at least part of a circuit for the substrate 202. The electrostatic discharge (ESD) protection circuit 706 may represent at least part of a circuit for the electrostatic discharge (ESD) protection component 206.

The die circuit 702 includes a first terminal 710 (e.g., internal die circuit I/O), a second terminal 712, a third terminal 714, and a fourth terminal 716. The first terminal 710, the second terminal 712, the third terminal 714 and the fourth terminal 716 may be input/output (I/O) terminals for a die (e.g., die 204). Different implementations of the circuit diagram 700 may have a different number of terminals.

The die circuit 702 also includes a plurality of diodes 720 arranged in series and/or in parallel to each other. The plurality of diodes 720 may be configured as an electrostatic discharge (ESD) protection component (e.g., internal electrostatic discharge (ESD) protection component 240) of a die (e.g., die 204).

The plurality of diodes 720 includes a diode 722, a diode 724, a diode 726, and a diode 728. The diode 722 is coupled in series to the diode 724. The first terminal 710 is connected between the diode 722 and the diode 724. The diode 726 is coupled in series to the diode 728. The second terminal 712 is connected between the diode 726 and the diode 728. The diode 722 and the diode 724 are in parallel to the diode 726 and the diode 728. A ground terminal 730 for a ground reference signal (Vss) is coupled to the anode portions of the diode 722 and the diode 726. A power terminal 732 for a power signal (Vdd) is coupled to the cathode portions of the diode 724 and the diode 728.

The electrostatic discharge (ESD) protection circuit 706 includes a plurality of diodes 760. The plurality of diodes 760 may be configured as an electrostatic discharge (ESD) protection component (e.g., electrostatic discharge (ESD) protection component 206) that is coupled to a package substrate (e.g., substrate 202).

The plurality of diodes 760 includes a diode 762, a diode 764, a diode 766, and a diode 768. The diode 762 is coupled in series to the diode 764. The diode 766 is coupled in series to the diode 768. The diode 762 and the diode 764 are in parallel to the diode 766 and the diode 768. The ground terminal 730 for a ground reference signal (Vss) is coupled to the anode portions of the diode 762 and the diode 766. The power terminal 732 for a power signal (Vdd) is coupled to the cathode portions of the diode 764 and the diode 768. A terminal between the diode 722 and the diode 724 is coupled to a terminal between the diode 762 and the diode 764. A terminal between the diode 726 and the diode 728 is coupled to a terminal between the diode 766 and the diode 768.

FIG. 7 also illustrates that input/output terminals (e.g., first terminal 710), ground terminal 730 and power terminal 732 are coupled to a printed circuit board (PCB) circuit 708. The PCB circuit 708 may represent at least part of a circuit for the PCB 250. In some implementations, the circuit diagram 700 illustrates how the internal electrostatic discharge (ESD) protection component of the die and the electrostatic discharge (ESD) protection component of the package substrate may provide cumulative electrostatic discharge (ESD) protection for the integrated circuit (IC) package (e.g., the die of the integrated circuit (IC) package).

FIG. 7 illustrates how cumulative electrostatic discharge (ESD) protection may be used to provide robust protection for the integrated circuit (IC) package. In some implementations, cumulative electrostatic discharge (ESD) protection is the use of two or more electrostatic discharge (ESD) protection components (e.g., electrostatic discharge (ESD) protection components coupled in parallel and/or in series) used in conjunction with each other to provide a more effective and powerful electrostatic discharge (ESD) protection. For example, as an analogy, two resistors coupled in series to each other provide an equivalent resistor that has a higher resistance than each of the individual resistor coupled to each other in series.

Similarly, two or more electrostatic discharge (ESD) protection components that are coupled to each other provide a cumulative electrostatic discharge (ESD) protection component that provides greater electrostatic discharge (ESD) protection than each of the individual electrostatic discharge (ESD) protection component. Thus, by grouping the electrostatic discharge (ESD) protection components from different portions of the integrated circuit (IC) package, the present disclosure provides an effective, efficient and robust electrostatic discharge (ESD) protection.

In addition, cumulative electrostatic discharge (ESD) protection may provide electrostatic discharge (ESD) protection even when one of the electrostatic discharge (ESD) protection component fails or does not operate as designed. Thus, cumulative electrostatic discharge (ESD) protection, through the use of several electrostatic discharge (ESD) protection components, may provide fault tolerant electrostatic discharge (ESD) protection for the integrated circuit (IC) package. For example, in the event that the electrostatic discharge (ESD) protection component in the die circuit 702 should fail (or not work properly), the electrostatic discharge (ESD) protection circuit 706 coupled to the package substrate circuit 704 may still work to provide electrostatic discharge (ESD) protection for the integrated circuit (IC) package (e.g., die of the IC package).

Figure 8:
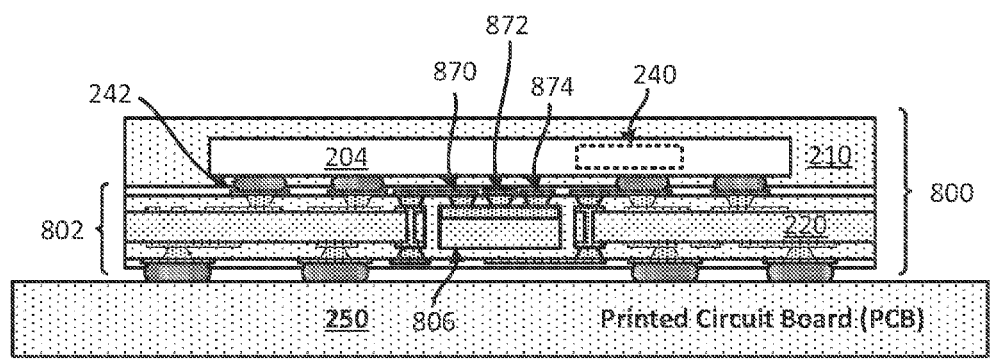
FIG. 8 illustrates a profile view of an example of an integrated circuit package that includes an electrostatic discharge (ESD) protection component embedded in a package substrate.

Exemplary Integrated Circuit (IC) Package Comprising an Electrostatic Discharge (ESD) Protection Component In some implementations, an electrostatic discharge (ESD) protection component may be embedded in a package substrate. FIG. 8 illustrates an example of a device package that includes an electrostatic discharge (ESD) protection component embedded in a package substrate. Specifically, FIG. 8 illustrates an example of an integrated circuit (IC) package 800 that includes a substrate 802, the die 204, an electrostatic discharge (ESD) protection component 806, and the encapsulation layer 210. The integrated circuit (IC) package 800 is mounted on a printed circuit board (PCB) 250. The die 204 may be an integrated circuit (IC) that includes several transistors and/or other electronic components. The die 204 may be a logic die and/or a memory die. The die 204 may include an internal electrostatic discharge (ESD) protection component 240.

The integrated circuit (IC) package 800 of FIG. 8 is similar to the integrated circuit (IC) package 200 of FIG. 2, except that the electrostatic discharge (ESD) protection component 806 is embedded in the substrate 802. In some implementations, the electrostatic discharge (ESD) protection component 806 is similar to the electrostatic discharge (ESD) protection component 206, as described in FIGS. 3-6.

FIG. 8 illustrates a first plurality of interconnects 870, a second plurality of interconnects 872, and a third plurality of interconnects 874 that are coupled to the electrostatic discharge (ESD) protection component 806. The first plurality of interconnects 870 are located in/on the substrate 802. The first plurality of interconnects 870 may include traces, vias and/or pads. The first plurality of interconnects 870 may be configured to provide an electrical path for a first input/output (I/O) signal to and from the die 204. The second plurality of interconnects 872 are located in/on the substrate 802. The second plurality of interconnects 872 may include traces, vias and/or pads. The second plurality of interconnects 872 may be configured to provide an electrical path for a power signal (e.g., Vdd) to the die 204. The third plurality of interconnects 874 are located in/on the substrate 802. The third plurality of interconnects 874 may include traces, vias and/or pads. The third plurality of interconnects 874 may be configured to provide an electrical path for a ground reference signal (e.g., Vss) from the die 204. The first plurality of interconnects 870, the second plurality of interconnects 872 and/or the third plurality of interconnects 872 may be coupled to the die 204 (e.g., through the first plurality of solder balls 242). Different implementations may have a different number of interconnects coupled to the electrostatic discharge (ESD) protection component 806.

In some implementations, the several electrostatic discharge (ESD) protection components (e.g., internal electrostatic discharge (ESD) protection component 240 of the die and the electrostatic discharge (ESD) protection component 806 of the package substrate) may provide cumulative electrostatic discharge (ESD) protection for the die 204 and the integrated circuit (IC) package 800, as described in FIG. 7 above.

Figure 9:
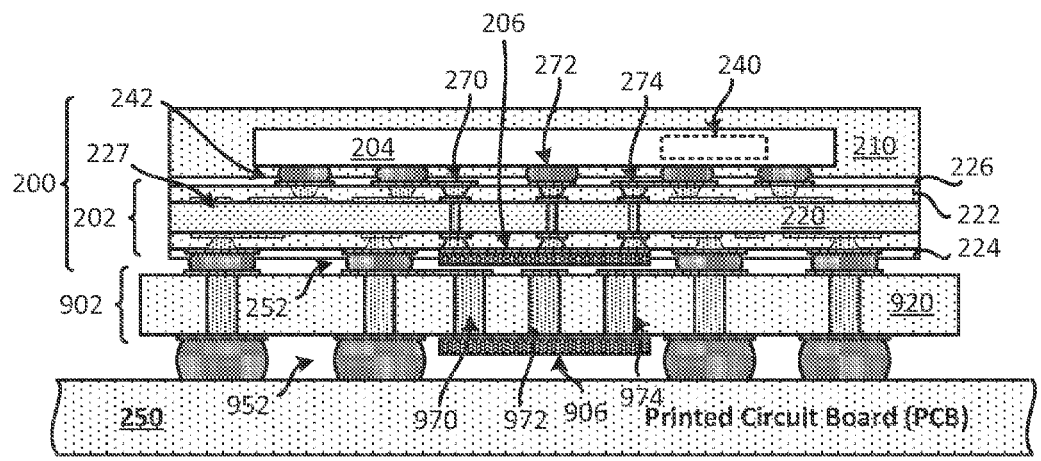
FIG. 9 illustrates a profile view of an example of an integrated circuit package that includes an electrostatic discharge (ESD) protection component coupled to an interposer.

Exemplary Integrated Circuit (IC) Package Comprising an Electrostatic Discharge (ESD) Protection Component Coupled to an Interposer In some implementations, an electrostatic discharge (ESD) protection component may be coupled to an interposer. FIG. 9 illustrates an example of a device package that includes an electrostatic discharge (ESD) protection component coupled to an interposer. Specifically, FIG. 9 illustrates an example of an integrated circuit (IC) package 200 that includes a substrate 202, the die 204, an electrostatic discharge (ESD) protection component 206, and the encapsulation layer 210. The integrated circuit (IC) package 200 is coupled to an interposer 902 through a plurality of solder balls 252. The interposer 902 is coupled to a printed circuit board (PCB) 250 through a plurality of solder balls 952.

The integrated circuit (IC) package 200 of FIG. 9 is similar to the integrated circuit (IC) package 200 of FIG. 2, except that the integrated circuit (IC) package 200 is coupled to the interposer 902 that includes the electrostatic discharge (ESD) protection component 906. In some implementations, the electrostatic discharge (ESD) protection component 906 is similar to the electrostatic discharge (ESD) protection component 206, as described in FIGS. 3-6. In some implementations, the interposer 902 may be coupled to the integrated circuit (IC) package 800 of FIG. 8, instead of the integrated circuit (IC) package 200.

FIG. 9 illustrates a first plurality of interconnects 970, a second plurality of interconnects 972, and a third plurality of interconnects 974 that are coupled to the electrostatic discharge (ESD) protection component 906. The first plurality of interconnects 970 are located in/on the interposer 902. The first plurality of interconnects 970 may include traces, vias, pads, bumps and/or solder interconnects. The first plurality of interconnects 970 may be configured to provide an electrical path for a first input/output (I/O) signal to and from the die 204. The second plurality of interconnects 972 are located in/on the interposer 902. The second plurality of interconnects 972 may include traces, vias, pads, bumps and/or solder interconnects. The second plurality of interconnects 972 may be configured to provide an electrical path for a power signal (e.g., Vdd) to the die 204. The third plurality of interconnects 974 are located in/on the interposer 902. The third plurality of interconnects 974 may include traces, vias, pads, bumps and/or solder interconnects. The third plurality of interconnects 974 may be configured to provide an electrical path for a ground reference signal (e.g., Vss) from the die 204. The first plurality of interconnects 970, the second plurality of interconnects 972 and/or the third plurality of interconnects 972 may be coupled to the die 204 (e.g., through the first plurality of solder balls 242, the solder balls 252). Different implementations may have a different number of interconnects coupled to the electrostatic discharge (ESD) protection component 906. In addition, the position or location of the electrostatic discharge (ESD) protection component 906 may be different in different implementations. For example, the electrostatic discharge (ESD) protection component 906 may be located over the interposer 902 or embedded in the interposer 902.

In some implementations, the several electrostatic discharge (ESD) protection components (e.g., internal electrostatic discharge (ESD) protection component 240 of the die, the electrostatic discharge (ESD) protection component 206 of the package substrate, and/or the electrostatic discharge (ESD) protection component 906 of the interposer) may provide cumulative electrostatic discharge (ESD) protection for the die 204 and the integrated circuit (IC) package 200. Cumulative electrostatic discharge (ESD) protection is further described in detail below in FIG. 10.

Figure 10:
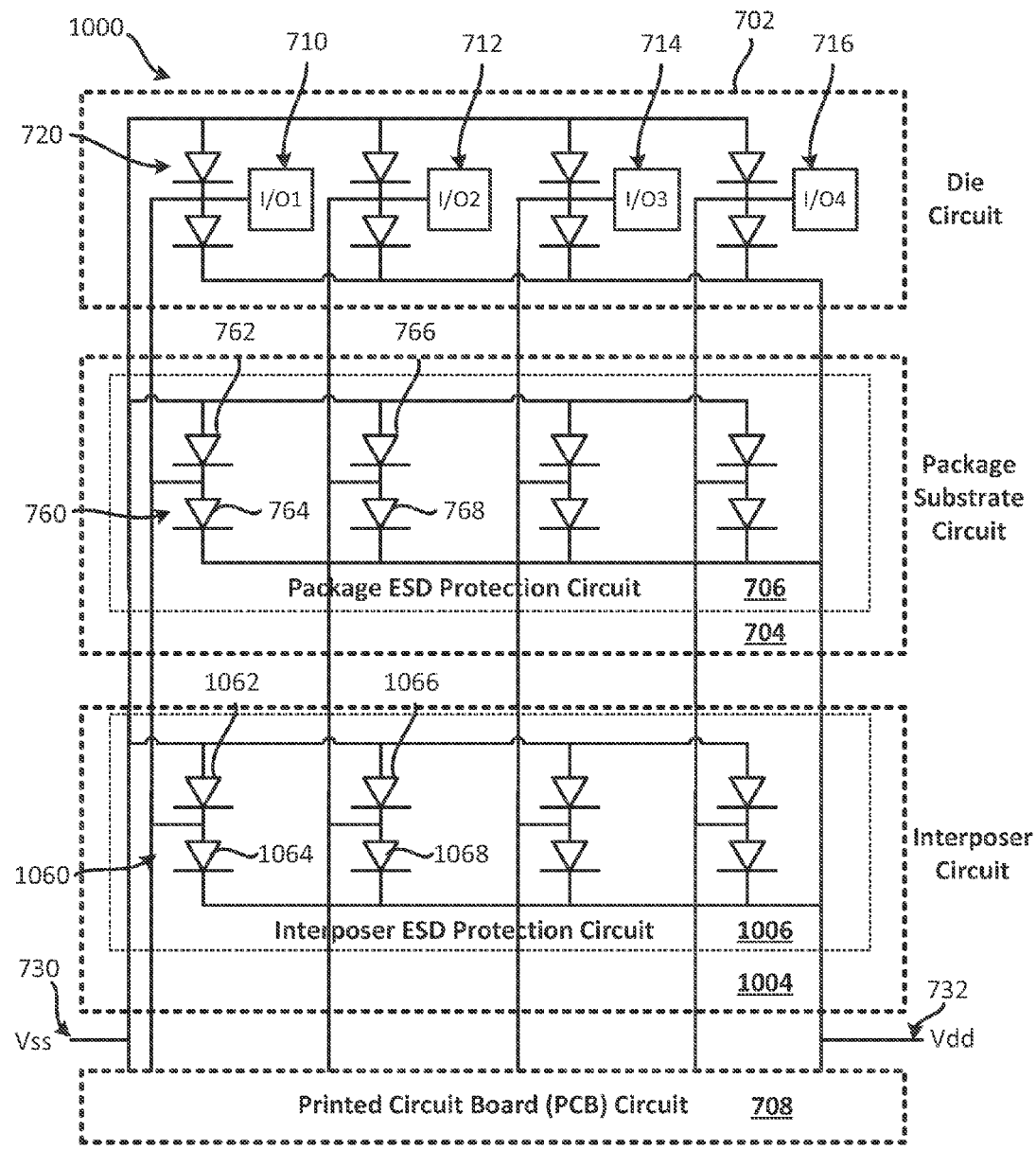
FIG. 10 illustrates an example of circuit diagram of a circuit in an integrated circuit package that includes an electrostatic discharge (ESD) protection component.

Exemplary Circuit Diagram of an Integrated Circuit (IC) Package Comprising an Electrostatic Discharge (ESD) Protection Component Coupled to an Interposer FIG. 10 illustrates another exemplary circuit diagram 1000 that includes several diodes configured to provide electrostatic discharge (ESD) protection in an integrated circuit (IC) package. The circuit diagram 1000 is similar to the circuit diagram 700 of FIG. 7, except that it includes additional circuits for additional electrostatic discharge (ESD) protection. The circuit diagram 1000 includes the die circuit 702, the package substrate circuit 704 and the electrostatic discharge (ESD) protection circuit 706 as described above in FIG. 7.

The circuit diagram 1000 also includes an interposer circuit 1004, and an electrostatic discharge (ESD) protection circuit 1006. The electrostatic discharge (ESD) protection circuit 1006 may be part of the interposer circuit 1004. The interposer circuit 1004 may represent at least part of a circuit for the interposer 902. The electrostatic discharge (ESD) protection circuit 1006 may represent at least part of a circuit for the electrostatic discharge (ESD) protection component 906.

The electrostatic discharge (ESD) protection circuit 1006 includes a plurality of diodes 1060. The plurality of diodes 1060 may be configured as an electrostatic discharge (ESD) protection component (e.g., electrostatic discharge (ESD) protection component 906) that is coupled to an interposer (e.g., interposer 902).

The plurality of diodes 1060 includes a diode 1062, a diode 1064, a diode 1066, and a diode 1068. The diode 1062 is coupled in series to the diode 1064. The diode 1066 is coupled in series to the diode 1068. The diode 1062 and the diode 1064 are in parallel to the diode 1066 and the diode 1068. The ground terminal 1030 for a ground reference signal (Vss) is coupled to the anode portions of the diode 1062 and the diode 1066. The power terminal 1032 for a power signal (Vdd) is coupled to the cathode portions of the diode 1064 and the diode 1068. A terminal between the diode 1062 and the diode 1064 is coupled to a terminal between the diode 762 and the diode 764. A terminal between the diode 1066 and the diode 1066 is coupled to a terminal between the diode 766 and the diode 768.

In some implementations, the circuit diagram 1000 illustrates how the internal electrostatic discharge (ESD) protection component 240 of the die, the electrostatic discharge (ESD) protection component 206 of the package substrate, and/or the electrostatic discharge (ESD) protection component 906 of the interposer may provide cumulative electrostatic discharge (ESD) protection for the die 204 and the integrated circuit (IC) package 200.

FIG. 10 illustrates how cumulative electrostatic discharge (ESD) protection may be used to provide robust protection for the integrated circuit (IC) package. In some implementations, cumulative electrostatic discharge (ESD) protection is the use of two or more electrostatic discharge (ESD) protection components (e.g., electrostatic discharge (ESD) protection components coupled in parallel and/or in series) used in conjunction with each other to provide a more effective and powerful electrostatic discharge (ESD) protection. For example, as an analogy, two resistors coupled in series to each other provide an equivalent resistor that has a higher resistance than each of the individual resistor coupled to each other in series.

Similarly, two or more electrostatic discharge (ESD) protection components that are coupled to each other provide a cumulative electrostatic discharge (ESD) protection component that provides greater electrostatic discharge (ESD) protection than each of the individual electrostatic discharge (ESD) protection component. Thus, by grouping the electrostatic discharge (ESD) protection components from different portions of the integrated circuit (IC) package, the present disclosure provides an effective, efficient and robust electrostatic discharge (ESD) protection. Cumulative electrostatic discharge (ESD) protection may include electrostatic discharge (ESD) protection from an electrostatic discharge (ESD) protection component of the die circuit 702, an electrostatic discharge (ESD) protection circuit 706 of the package substrate circuit 704, and/or an electrostatic discharge (ESD) protection circuit 1006 of the interposer circuit 1004.

In addition, cumulative electrostatic discharge (ESD) protection may provide electrostatic discharge (ESD) protection even when one or more of the electrostatic discharge (ESD) protection components fail or does not operate as designed. Thus, cumulative electrostatic discharge (ESD) protection, through the use of several electrostatic discharge (ESD) protection components, may provide fault tolerant electrostatic discharge (ESD) protection for the integrated circuit (IC) package. For example, in the event that the electrostatic discharge (ESD) protection circuit 706 coupled to the package substrate circuit 704 should fail (or not work properly), the electrostatic discharge (ESD) protection circuit 1006 coupled to the interposer circuit 1004 may still work to provide electrostatic discharge (ESD) protection for the integrated circuit (IC) package (e.g., die of the IC package).

Figure 11A:
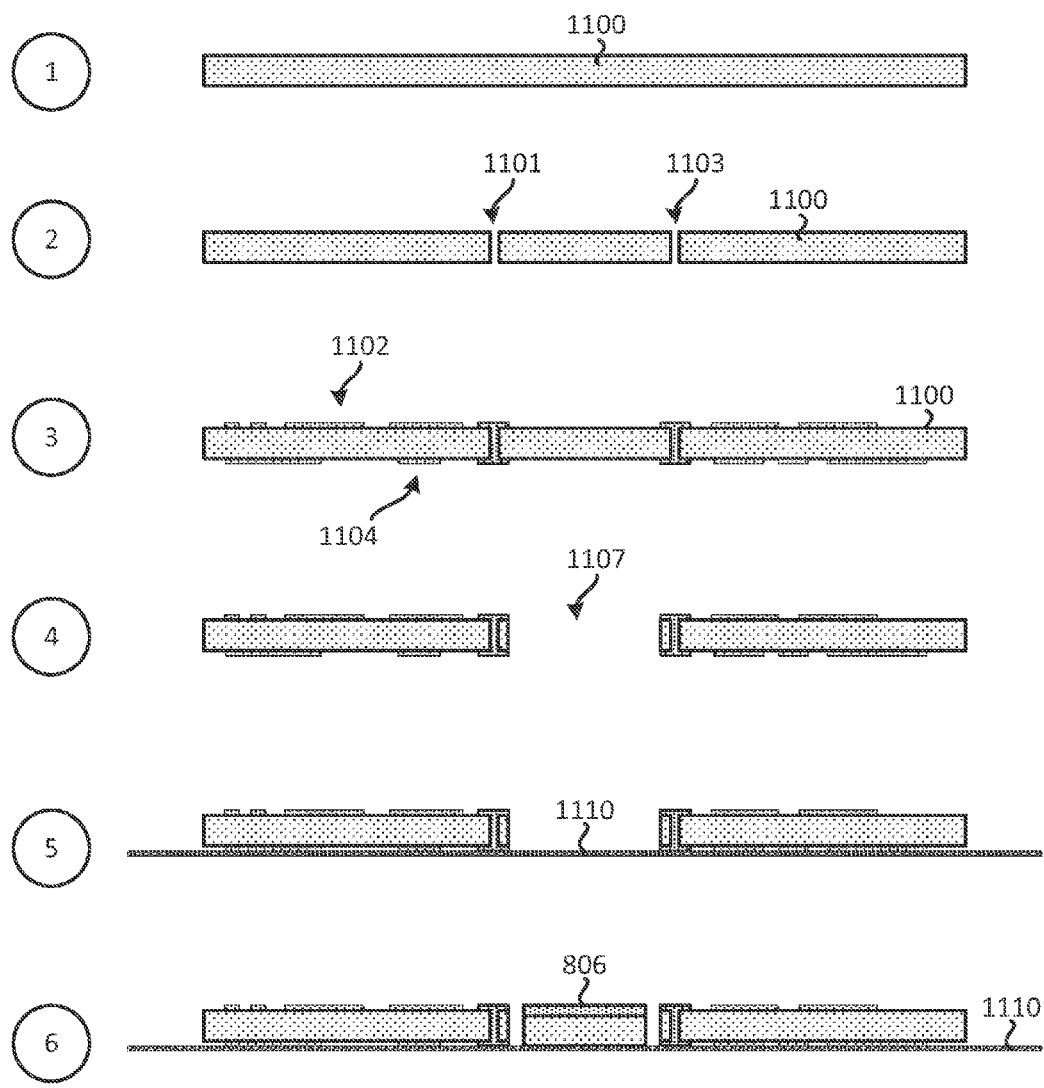
FIG. 11 (which includes FIGS. 11A-11C) illustrates an exemplary sequence for providing/fabricating an integrated circuit package that includes an electrostatic discharge (ESD) protection component.
Figure 11B:
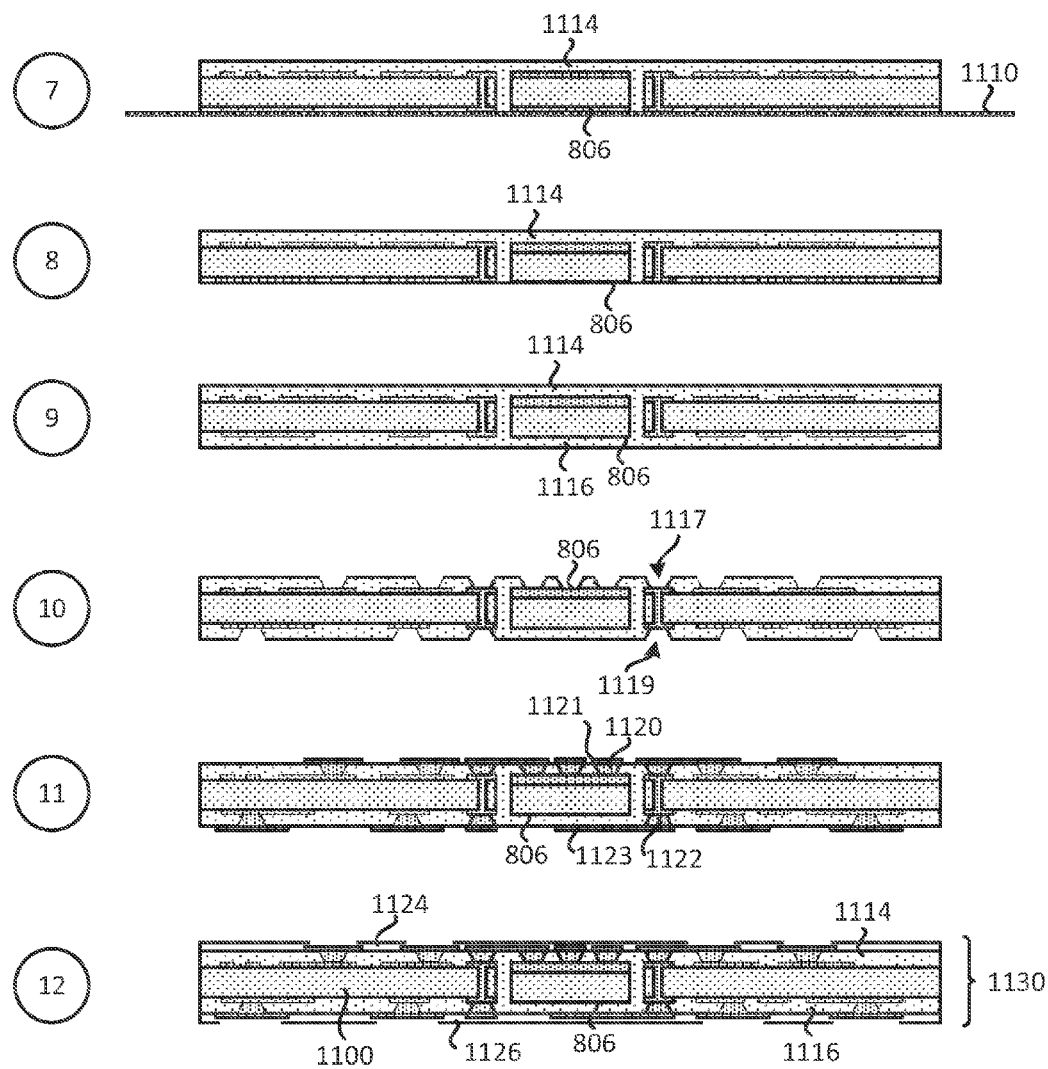
Figure 11C:
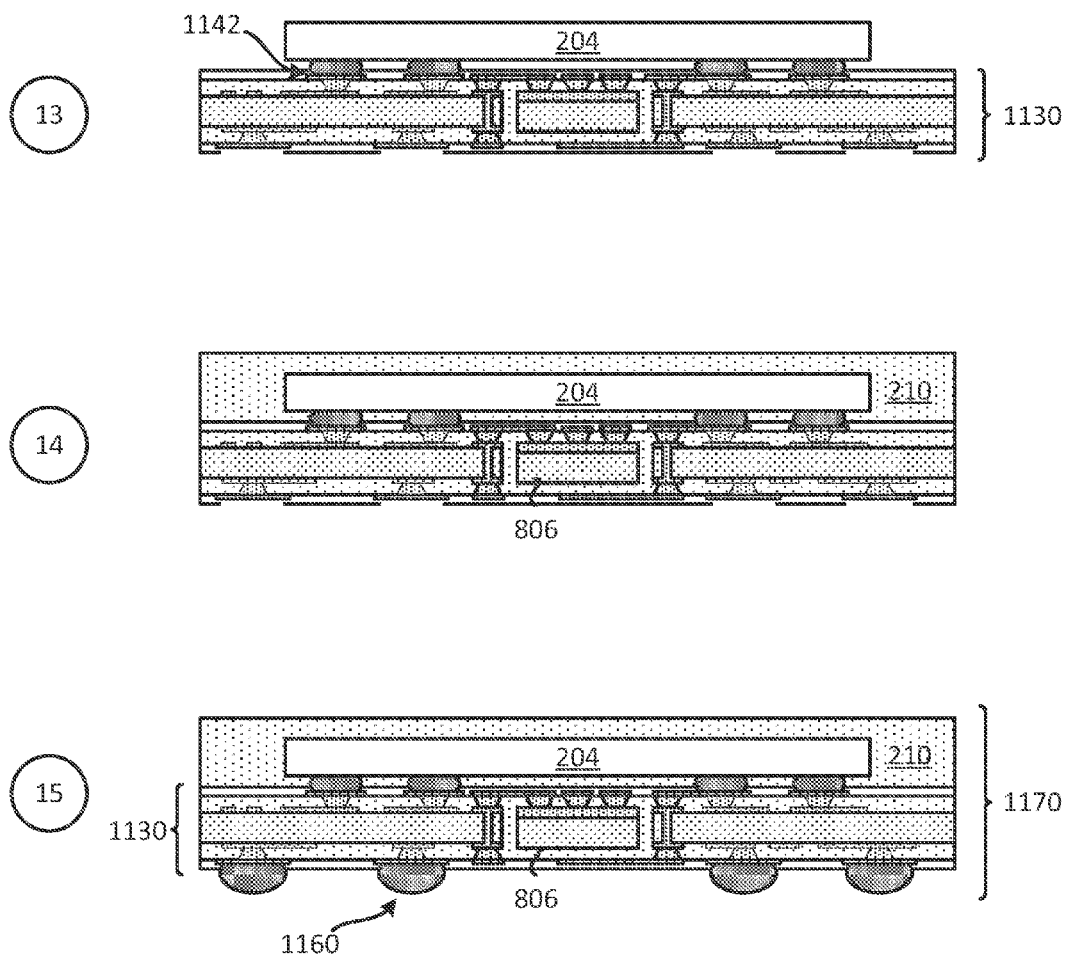

Exemplary Sequence for Fabricating an Integrated Circuit (IC) Package Comprising an Electrostatic Discharge (ESD) Protection Component In some implementations, providing/fabricating an integrated circuit (IC) package that includes an electrostatic discharge (ESD) protection component includes several processes. FIG. 11 (which includes FIGS. 11A-11C) illustrates an exemplary sequence for providing/fabricating a device package (e.g., integrated circuit (IC) package) that an electrostatic discharge (ESD) protection component. In some implementations, the sequence of FIGS. 11A-11C may be used to provide/fabricate the integrated circuit (IC) package 800 of FIG. 8 and/or other integrated circuit (IC) packages described in the present disclosure.

It should be noted that the sequence of FIGS. 11A-11C may combine one or more stages in order to simplify and/or clarify the sequence for providing/fabricating a integrated circuit (IC) package that includes an electrostatic discharge (ESD) protection component. In some implementations, the order of the processes may be changed or modified.

Stage 1, as shown in FIG. 11A, illustrates a state after a dielectric layer 1100 is provided. The dielectric layer 1100 may be a core layer. In some implementations, the dielectric layer 1100 is provided by a supplier. In some implementations, the dielectric layer 1100 is fabricated (e.g., formed).

Stage 2 illustrates a state after a first cavity 1101 and a second cavity 1103 are formed in the dielectric layer 1100. Different implementations may form the first cavity 1101 and the second cavity 1103 differently. In some implementations, a laser process may be used to form the cavities.

Stage 3 illustrates a state after a first metal layer 1102 and a second metal layer 1104 are formed on the dielectric layer 1100. The forming and patterning of the first metal layer 1102 and the second metal layer 1104 may form and define interconnects (e.g., traces, pads, vias) on the dielectric layer 1100. Different implementations may use different processes for forming the first metal layer 1102 and the second metal layer 1104. A photo-lithography process (e.g., photo-etching process) may be use to pattern the metal layers. Patterning methods could include modified semi-additive or semi-additive patterning processes (SAP).

Stage 4 illustrates a state after a cavity 1107 is formed in the dielectric layer 1100. In some implementations, a laser is used to form (e.g., remove) portions of the dielectric layer 1100.

Stage 5 illustrates a state after the dielectric layer 1100 that includes interconnects, is coupled to a carrier 1110.

Stage 6 illustrates a state after an electrostatic discharge (ESD) protection component 806 is positioned in the cavity 1107 of the dielectric layer 1100 (e.g., core layer). The electrostatic discharge (ESD) protection component 806 may any of the electrostatic discharge (ESD) protection components described in the present disclosure. The electrostatic discharge (ESD) protection component 806 is positioned over the carrier 1110.

Stage 7, as shown in FIG. 11B, illustrates a state after a second dielectric layer 1114 is formed on a first surface of the dielectric layer 1100, the cavity 1107 and the electrostatic discharge (ESD) protection component 806. The second dielectric layer 1114 may be prepeg layer.

Stage 8 illustrates a state after the carrier 1110 is decoupled (e.g., detached) from the dielectric layer 1100.

Stage 9 illustrates a state after a third dielectric layer 1116 is formed on a second side of the dielectric layer 1100. In some implementations, the third dielectric layer 1116 and the second dielectric layer 1114 are the same dielectric layer. Stage 9 illustrates that the second dielectric layer 1114 and/or the third dielectric layer at least partially encapsulates the electrostatic discharge (ESD) protection component 806.

Stage 10 illustrates a state after a cavity 1117 is formed in the second dielectric layer 1114, and a cavity 1119 is formed in the third dielectric layer 1116. A photo-etching process may be used to form the cavity. Stage 10 involves via cavity formation and patterning for the second and third dielectric layers. Patterning methods could include modified semi-additive or semi-additive patterning processes (SAP).

Stage 11 illustrates a state after an interconnect 1120 (e.g., via) and an interconnect 1121 (e.g., trace) are formed in/on the second dielectric layer 1114, and an interconnect 1122 (e.g., via) and an interconnect 1123 (e.g., trace) are formed in/on the third dielectric layer 1116. The interconnect 1120 is coupled to the interconnect 1121 and the electrostatic discharge (ESD) protection component 806.

Stage 12 illustrates a state after a first solder resist layer 1124 is formed on the second dielectric layer 1114, and a second solder resist layer 1126 is formed on the third dielectric layer 1116. Stage 12 illustrates a substrate 1130 that includes the dielectric layer 1100, the electrostatic discharge (ESD) protection component 806, the second dielectric layer 1114, the third dielectric layer 1116, several interconnects (e.g., interconnect 1120), the first solder resist layer 1124, and the second solder resist layer 1126. The substrate 1130 may be a package substrate. The substrate 1130 may be similar to the substrate 202.

Stage 13, as shown in FIG. 11C, illustrates a state after a die 204 is coupled (e.g., mounted) to the substrate 1130 through a plurality of solder balls 1142. The die 204 may be coupled to the substrate 1130 differently. In some implementations, the die 204 may include an internal electrostatic discharge (ESD) protection component 240 as described in FIG. 2.

Stage 14 illustrates a state after an encapsulation layer 210 is formed on the substrate 1130 and the die 204. In some implementations, the encapsulation layer 210 comprises a mold and/or epoxy fill.

Stage 15 illustrates a state after a plurality of solder balls 1160 is coupled to the substrate 1130. In some implementations, stage 15 illustrates an integrated circuit (IC) package 1170 that includes the substrate 1130, the electrostatic discharge (ESD) protection component 806, the die 204, and the encapsulation layer 210. In some implementations, the integrated circuit (IC) package 1170 is similar to the integrated circuit (IC) package 800 as described and illustrated in FIG. 8.

Figure 12A:
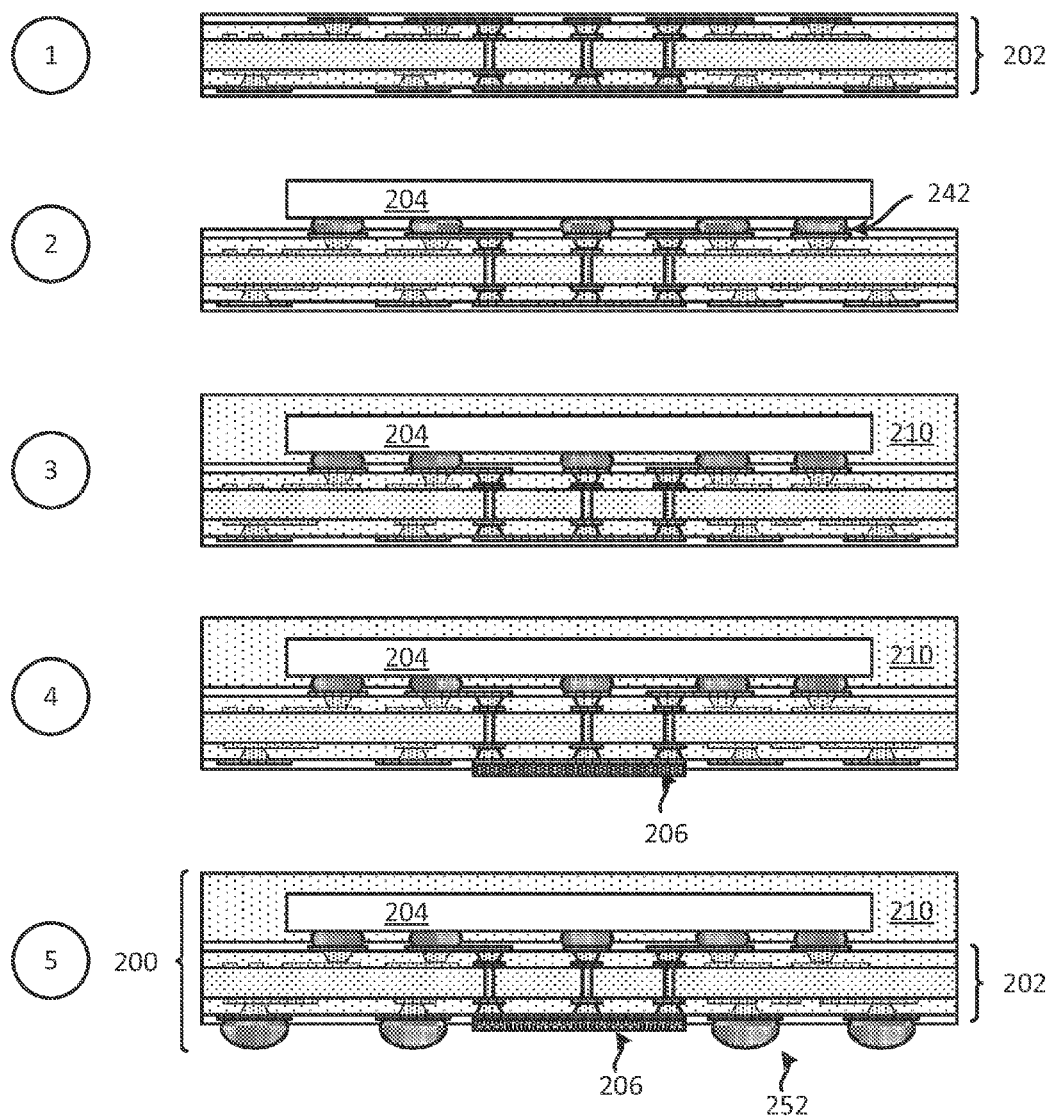
FIG. 12 (which includes FIGS. 12A-12B) illustrates an exemplary sequence for providing/fabricating an integrated circuit package that includes an electrostatic discharge (ESD) protection component coupled to an interposer.
Figure 12B:
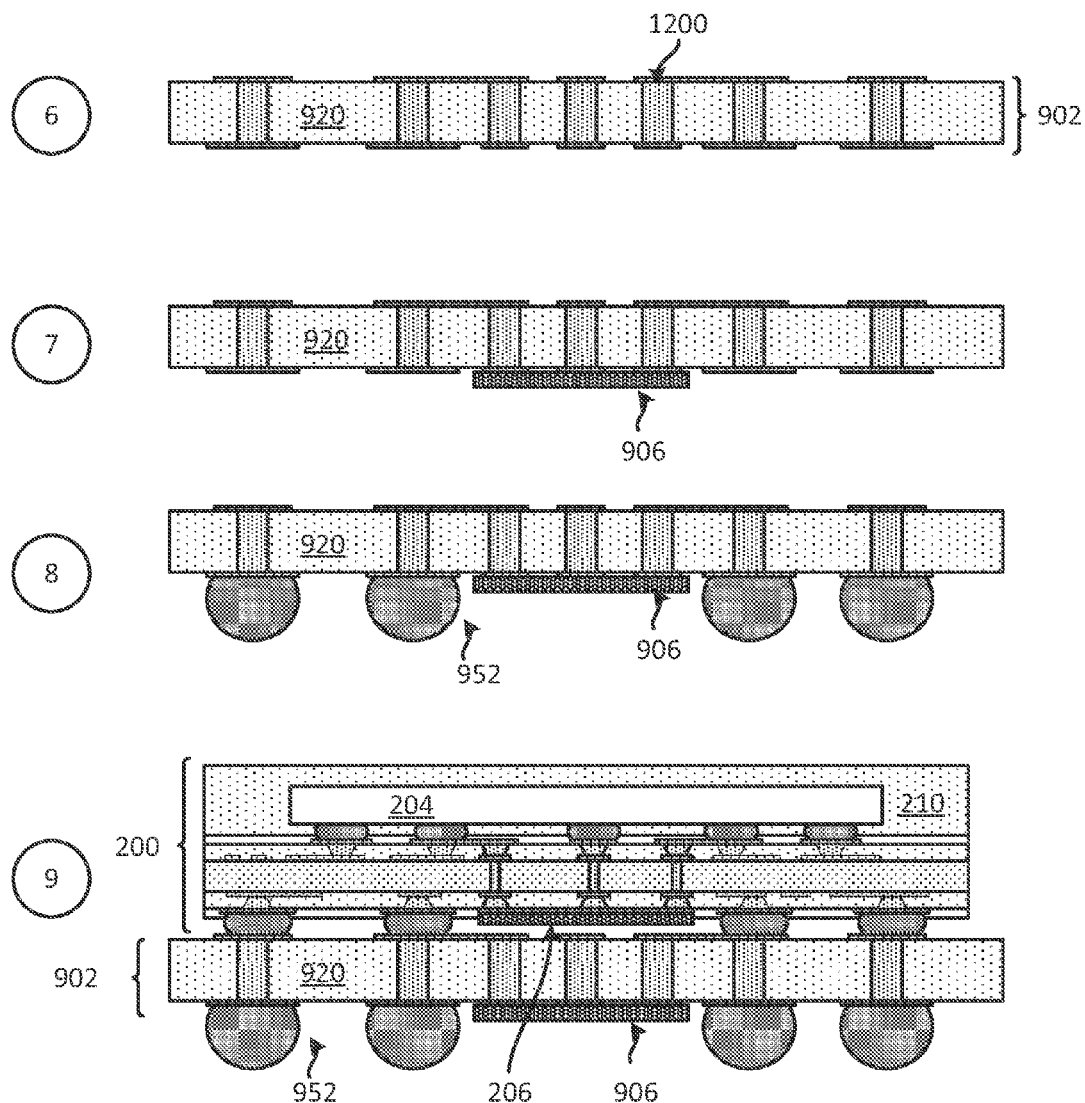

Exemplary Sequence for Fabricating an Integrated Circuit (IC) Package Comprising an Electrostatic Discharge (ESD) Protection Component In some implementations, providing/fabricating a device package that includes an electrostatic discharge (ESD) protection component, includes several processes. FIG. 12 (which includes FIGS. 12A-12B) illustrates an exemplary sequence for providing/fabricating a device package (e.g., integrated circuit (IC) package) that includes an electrostatic discharge (ESD) protection component. In some implementations, the sequence of FIGS. 12A-12B may be used to provide/fabricate the integrated circuit (IC) package 900 of FIG. 9 and/or other integrated circuit (IC) packages described in the present disclosure.

It should be noted that the sequence of FIGS. 12A-12B may combine one or more stages in order to simplify and/or clarify the sequence for providing/fabricating a integrated circuit (IC) package that includes an electrostatic discharge (ESD) protection component. In some implementations, the order of the processes may be changed or modified.

Stage 1, as shown in FIG. 12A, illustrates a state after a substrate 202 is provided. The substrate 202 may be a package substrate. The substrate 202 may include at least one dielectric layer (e.g., core layer, prepeg layer), several interconnects (e.g., traces, pads, vias), and at least one solder resist layer (e.g., first solder resist layer, second solder resist layer), as described in FIGS. 2 and 9.

Stage 2 illustrates a state after a die 204 is coupled (e.g., mounted) to the substrate 202 through a plurality of solder balls 242. The die 204 may be coupled to the substrate 202 differently. In some implementations, the die 204 may include an internal electrostatic discharge (ESD) protection component 240 as described in FIG. 2.

Stage 3 illustrates a state after an encapsulation layer 210 is formed on the substrate 202 and the die 204. In some implementations, the encapsulation layer 210 comprises a mold and/or epoxy fill.

Stage 4 illustrates a state after an electrostatic discharge (ESD) protection component 206 is coupled (e.g., mounted) to the substrate 202. In some implementations, solder may be used to couple the electrostatic discharge (ESD) protection component 206 to the substrate 202. However, different implementations may couple the electrostatic discharge (ESD) protection component 206 to the substrate 202 differently.

Stage 5 illustrates a state after a plurality of solder balls 252 is coupled to the substrate 202. In some implementations, stage 5 illustrates an integrated circuit (IC) package 200 that includes the substrate 202, the electrostatic discharge (ESD) protection component 206, the die 204, and the encapsulation layer 210. In some implementations, the integrated circuit (IC) package 200 at stage 5 is similar to the integrated circuit (IC) package 200 of FIG. 2.

Stage 6, as shown in FIG. 12B, illustrates a state after an interposer 902 is provided. The interposer 902 includes a dielectric layer 920 and several interconnects 1200. The interconnects 1200 may includes traces, vias, and/or pads. The interconnects 1200 may include a first plurality of interconnects 970, a second plurality of interconnects 972, and a third plurality of interconnects 974, as described in FIG. 9.

Stage 7 illustrates a state after an electrostatic discharge (ESD) protection component 906 is coupled (e.g., mounted) to the interposer 902. In some implementations, a solder interconnect may be used to couple the electrostatic discharge (ESD) protection component 906 to the interposer 902. However, different implementations may couple the electrostatic discharge (ESD) protection component 906 to the interposer 902 differently.

Stage 8 illustrates a state after a plurality of solder balls 952 is coupled to the interposer 902.

Stage 9 illustrates a state after the integrated circuit (IC) package 200 is coupled to the interposer 902 that includes the electrostatic discharge (ESD) protection component 906.

Figure 13:
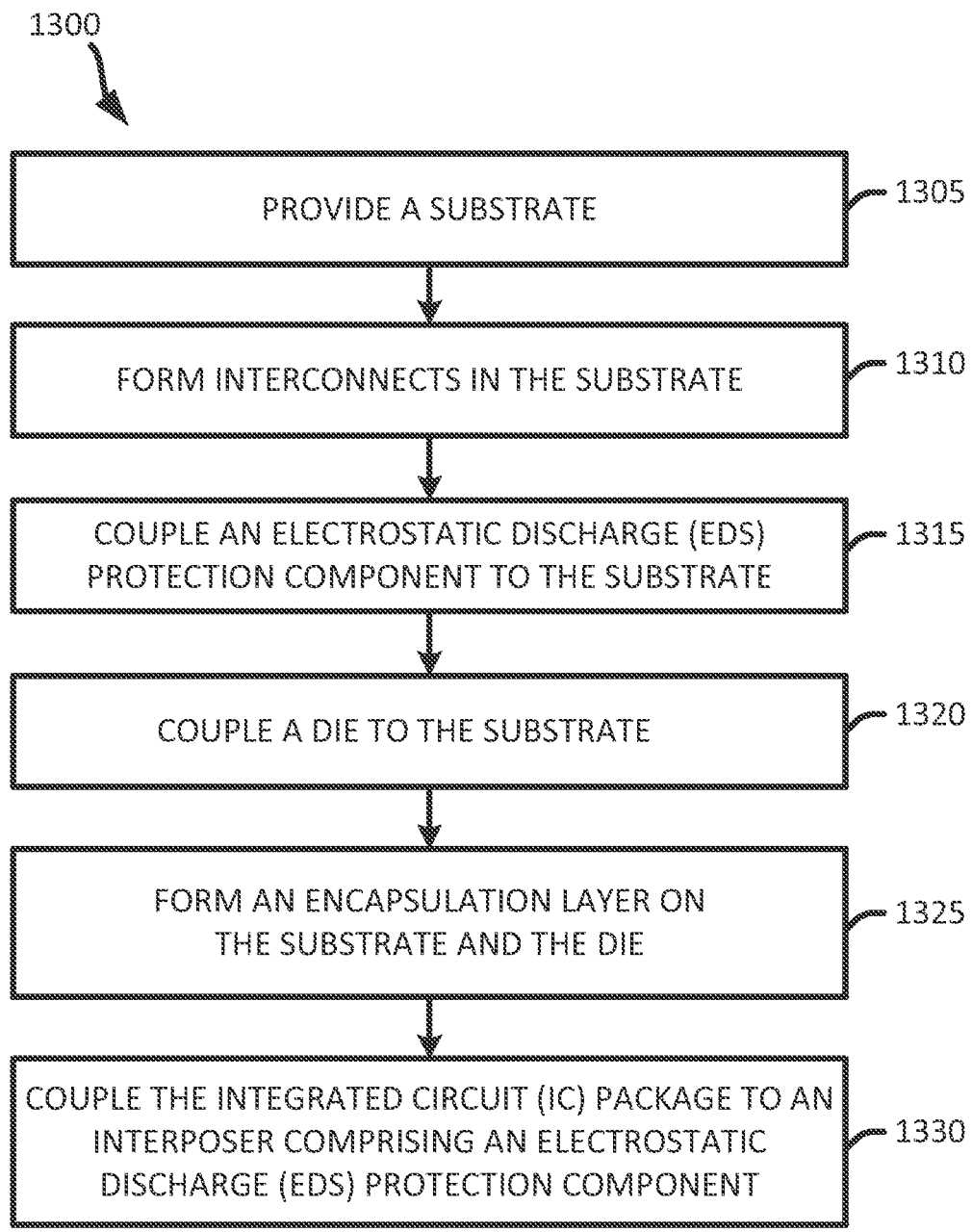
FIG. 13 illustrates an exemplary flow diagram of a method for providing/fabricating an integrated circuit package that includes an electrostatic discharge (ESD) protection component.

Exemplary Flow Diagram of a Method for Fabricating an Integrated Circuit (IC) Package Comprising an Electrostatic Discharge (ESD) Protection Component FIG. 13 illustrates an exemplary flow diagram of a method 1300 for providing/fabricating a device package (e.g., integrated circuit (IC) package) that includes an electrostatic discharge (ESD) protection component. In some implementations, the method of FIG. 13 may be used to provide/fabricate the integrated circuit (IC) package 200 of FIG. 9 and/or other integrated circuit (IC) packages described in the present disclosure.

It should be noted that the flow diagram of FIG. 13 may combine one or more processes in order to simplify and/or clarify the method for providing an integrated circuit (IC) package. In some implementations, the order of the processes may be changed or modified.

The method provides (at 1305) a substrate. In some implementations, the substrate is provided by a supplier. In some implementations, the substrate is fabricated (e.g., formed). The substrate may be a package substrate. The substrate (e.g., substrate 202) may include a dielectric layer (e.g., core layer) and metal layers on the dielectric layer.

The method forms (at 1310) several interconnects in and on the substrate. Different implementations may use different processes for forming the interconnects. A photo-lithography process (e.g., photo-etching process) may be use to pattern metal layer into interconnects. Patterning methods could include modified semi-additive or semi-additive patterning processes (SAP).

The method couples (at 1315) an electrostatic discharge (ESD) protection component (e.g., electrostatic discharge (ESD) protection component 206) to the substrate (e.g., substrate 202). The electrostatic discharge (ESD) protection component may be coupled to the substrate through a solder interconnect (or through bump and solder interconnect).

The method couples (at 1320) a die (e.g., die 204) to the substrate (e.g., substrate 202). The die may include an internal electrostatic discharge (ESD) protection component (e.g., electrostatic discharge (ESD) protection component 240). A plurality of solder balls may be used to couple the die to the substrate.

The method forms (at 1325) an encapsulation layer (e.g., encapsulation layer 210) over the die and the substrate. The encapsulation layer may comprise a mold and/or an epoxy fill. In some implementations, the substrate, the electrostatic discharge (ESD) protection component, the die and the encapsulation layer may form an integrated circuit (IC) package (e.g., integrated circuit (IC) package 200).

The method couples (at 1330) the integrated circuit (IC) package (e.g., integrated circuit (IC) package 200) to an interposer (e.g., interposer 902) that includes an electrostatic discharge (ESD) protection component (e.g., electrostatic discharge (ESD) protection component 906). In some implementations, the several electrostatic discharge (ESD) protection components (e.g., internal electrostatic discharge (ESD) protection component 240 of the die, the electrostatic discharge (ESD) protection component 206 of the package substrate, and/or the electrostatic discharge (ESD) protection component 906 of the interposer) may be configured to provide cumulative electrostatic discharge (ESD) protection for the die 204 and the integrated circuit (IC) package 200.

Electrostatic Discharge Protection (ESD) Models

An electrostatic discharge (ESD) is the sudden flow of electricity between two electrically charged objects caused by contact, an electrical short, or dielectric breakdown. A buildup of static electricity may be caused by tribocharging or by electrostatic induction. The ESD occurs when objects with different charges are brought close together or when the dielectric between them breaks down.

An electrostatic discharge (ESD) can cause damage to sensitive electronic devices (e.g., dies, integrated circuit (IC) packages, device packages). These devices can suffer permanent damage when subjected to high voltages. Thus, these devices are designed to withstand some level of electrostatic discharge (ESD). The level of electrostatic discharge (ESD) protection will depend on the assembly environment. For example, a mobile device may have a different level of electrostatic discharge (ESD) requirement than the level of electrostatic discharge (ESD) requirement of an automotive device.

To account for these different applications (e.g., mobile applications, automotive applications), different testing models have been established to test and determine whether a device or device package (e.g., integrated circuit (IC) package) is appropriate for a particular application (e.g., whether a device package can be used in an automotive device and/or automotive application).

Examples of electrostatic discharge (ESD) testing models include a human body model (HBM) testing model and a charged device model (CDM) testing model.

The HBM testing model is used to characterize the susceptibility of an electronic component or electronic device to ESD damage. The test simulates an electrical discharge of a human onto an electronic component, which could occur if a human has built up charge.

In some implementations, the HBM testing model is setup by applying a high-voltage supply in series with a charging resistor (e.g., a 1-MΩ resistor or higher) and a capacitor (e.g., a 100-pF capacitor). After the capacitor is fully charged, a switch is used to remove it from the high-voltage supply and series resistor and to apply it in series with a discharge resistor (e.g., a 1.5-kΩ resistor) and the device under test (DUT) (e.g., device package, integrated circuit (IC) package). The voltage thus fully dissipates through the discharge resistor and the DUT. Different HBM testing models may use different values for the high-voltage supply range, depending on the application of the device. In some implementations, the voltage used during the test may be between about 0.5 kV and 4 kV. Different implementations may use different peak current that is between about 0.4 A and 3 A. In some implementations, the HBM testing models may use a discharge time of about 300 nanoseconds (nS) or less.

The CDM testing model is used to model what often happen in automated-manufacturing environments in which machines often remain on indefinitely, causing the electronic integrated circuits (ICs) to electrically charge over time. When the part of the IC comes into contact with a grounded conductor, the built-up charge on the part's capacitance discharges.

In some implementations, a CDM testing model may use voltages between about 250V and 1000V. Examples of CDM testing models include a 250V CDM model, a 500V CDM model, a 750V CDM model, and a 1000V CDM model. Different implementations may use a different peak current that is between about 4 A and 12 A. In some implementations, the CDM testing models may use a discharge time of about 1 nanosecond (nS) or less.

As mentioned above, the ESD testing model that is used will depend on the application the device is intended to be used in or implemented in. For example, a mobile device may require a particular ESD testing model that is different than for an ESD testing model of an automotive device.

In some implementations, for example, a device package (e.g., integrated circuit (IC) package) designed to be used in a mobile device or as a mobile application, may pass a testing model for a mobile device, but may not be able to pass a testing model for an automotive device or an automotive application, without making changes to the device circuit or package. In some implementations, one or more electrostatic discharge protection (ESD) components are provided in a device package in order to ensure that the device package passes a different testing model. In some implementations, using this approach avoids having to redesign the die in the device package, while providing a device package that is used and implemented in an electronic device that is different than what the die and device package were initially designed for, saving substantial design and manufacturing costs.

Exemplary Electronic Devices

Figure 14:
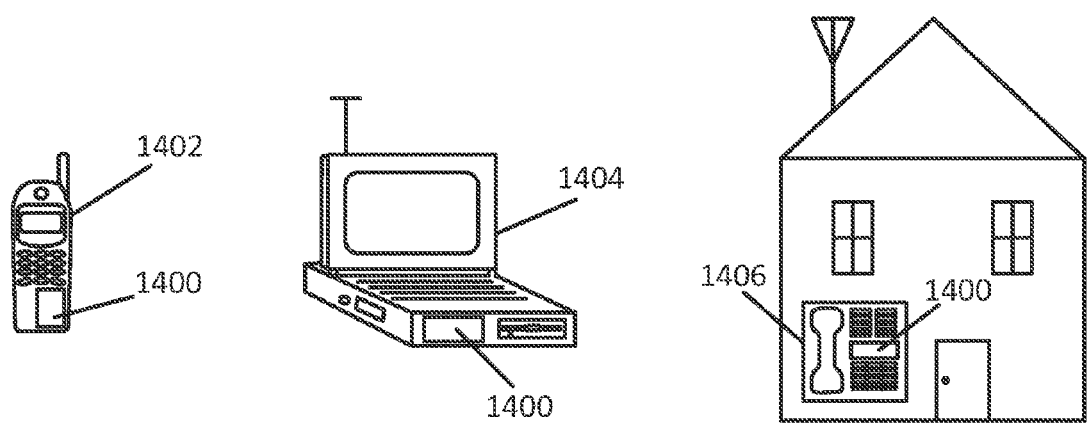
FIG. 14 illustrates various electronic devices that may integrate an integrated circuit package, a semiconductor device, a die, an integrated circuit and/or PCB described herein.

FIG. 14 illustrates various electronic devices that may be integrated with any of the aforementioned integrated circuit device, semiconductor device, integrated circuit, die, interposer, package or package-on-package (PoP). For example, a mobile phone device 1402, a laptop computer device 1404, and a fixed location terminal device 1406 may include an integrated circuit device 1400 as described herein. The integrated circuit device 1400 may be, for example, any of the integrated circuits, dies, integrated circuit devices, integrated circuit device packages, integrated circuit devices, package-on-package devices described herein. The devices 1402, 1404, 1406 illustrated in FIG. 14 are merely exemplary. Other electronic devices may also feature the integrated circuit device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, features, and/or functions illustrated in FIGS. 2, 3, 4, 5, 6, 7, 8, 9, 10, 11A-11C, 12A-12B, 13, and/or 14 may be rearranged and/or combined into a single component, feature or function or embodied in several components, or functions. Additional elements, components, and/or functions may also be added without departing from the disclosure. It should also be noted that FIGS. 2, 3, 4, 5, 6, 7, 8, 9, 10, 11A-11C, 12A-12B, 13, and/or 14 and its corresponding description in the present disclosure is not limited to dies and/or ICs. In some implementations, FIGS. 2, 3, 4, 5, 6, 7, 8, 9, 10, 11A-11C, 12A-12B, 13, and/or 14 and its corresponding description may be used to manufacture, create, provide, and/or produce integrated circuit devices. In some implementations, a device may include a die, a die package, an integrated circuit (IC), an integrated circuit device, an integrated circuit (IC) package, a device package, a wafer, a semiconductor device, a package on package structure, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the implementations may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
   a die;
   a package substrate coupled to the die; and
   a first electrostatic discharge (ESD) protection component coupled to the package substrate, wherein the first electrostatic discharge (ESD) protection component is configured to provide package level electrostatic discharge (ESD) protection such that the die can satisfy a second test comprising a second testing model when the second test is applied to the package, wherein the die without the first electrostatic discharge (ESD) protection component, is configured to satisfy a first test comprising a first testing model but not satisfy the second test comprising the second testing model.

2. The package of claim 1, wherein the first electrostatic discharge (ESD) protection component is embedded in the package substrate.

3. The package of claim 1, wherein the die comprises an internal electrostatic discharge (ESD) protection component configured to provide die level electrostatic discharge (ESD) protection.

4. The package of claim 3, wherein the internal electrostatic discharge (ESD) protection component and the first electrostatic discharge (ESD) protection component are configured to provide cumulative electrostatic discharge (ESD) protection for the package.

5. The package of claim 3, wherein the internal electrostatic discharge (ESD) protection component and the first electrostatic discharge (ESD) protection component are configured to provide fault tolerant electrostatic discharge (ESD) protection for the package.

6. The package of claim 1, wherein the die is configured to operate at a first voltage provided to the package, and wherein the first electrostatic discharge (ESD) protection component allows the die to operate when the package is coupled to a power source that provides a second discharge voltage to the package.

7. The package of claim 1, wherein the die is configured to operate at a first current provided to the package, and wherein the first electrostatic discharge (ESD) protection component allows the die to operate if the package is coupled to a power source that provides a second discharge current to the package.

8. The package of claim 1, wherein the first electrostatic discharge (ESD) protection component comprises a plurality of diodes.

9. The package of claim 8, wherein at least some of the diodes from the plurality of diodes are configured to share a power signal.

10. The package of claim 8, wherein at least some of the diodes from the plurality of diodes are configured to share a ground reference signal.

11. The package of claim 8, wherein the die comprises a plurality of input/output (I/O) terminals, wherein each input/output (I/O) terminal is coupled to at least one diode from the plurality of diodes.

12. The package of claim 1, wherein the first electrostatic discharge (ESD) protection component comprises:
a first P+ layer;
a first interconnect coupled to the first P+ layer;
a first N+ layer;
a second P+ layer;
a second interconnect coupled to the first N+ layer and the second P+ layer;
a second N+ layer; and
a third interconnect coupled to the second N+ layer.

13. The package of claim 12, wherein the first interconnect is configured to provide a first electrical path for a ground reference signal (Vss), the second interconnect is configured to provide a second electrical path for an input/output (I/O) signal, and the third interconnect is configured to provide a third electrical for a power signal (Vdd).

14. The package of claim 12, further comprising a dielectric layer.

15. The package of claim 12, further comprising:
a second P− layer that at least partially encapsulates the first P+ layer;
a first N− layer that at least partially encapsulates the second P− layer and the first N+ layer;
a second N− layer that at least partially encapsulates the second N+ layer; and
a first P− layer that at least partially encapsulates the first N− layer, the second P+ layer and the second N− layer.

16. The package of claim 1, wherein the package is coupled to an interposer comprising a second electrostatic discharge (ESD) protection component, and the package further comprising the interposer and the second electrostatic discharge (ESD) protection component.

17. The package of claim 16, wherein the first electrostatic discharge (ESD) protection component and the second electrostatic discharge (ESD) protection component are configured to provide cumulative electrostatic discharge (ESD) protection for the package.

18. The package of claim 16, wherein the first electrostatic discharge (ESD) protection component and the second electrostatic discharge (ESD) protection component are configured to provide fault tolerant electrostatic discharge (ESD) protection for the package.

19. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

20. The package of claim 1, wherein the first testing model comprises an electrostatic discharge (ESD) testing model for a mobile device, and the second testing model comprises an electrostatic discharge (ESD) testing model for an automotive device.

21. The package of claim 1, wherein the first electrostatic discharge (ESD) allows the package to operate with a current of about 4 amps (A) or greater, when the die is configured to operate with a current of about 3 amps (A) or lower.

22. The A package comprising:
a die;
a package substrate coupled to the die; and
a first electrostatic discharge (ESD) protection component coupled to the package substrate, wherein the first electrostatic discharge (ESD) protection component is configured to provide package level electrostatic discharge (ESD) protection, wherein the first electrostatic discharge (ESD) protection component comprises:
a first P+ layer;
a first interconnect coupled to the first P+ layer;
a first N+ layer;
a second P+ layer;
a second interconnect coupled to the first N+ layer and the second P+ layer;
a second N+ layer;
a third interconnect coupled to the second N+ layer;
a second P− layer that at least partially encapsulates the first P+ layer;
a first N− layer that at least partially encapsulates the second P− layer and the first N+ layer;
a second N− layer that at least partially encapsulates the second N+ layer;
a first P− layer that at least partially encapsulates the first N− layer, the second P+ layer and the second N− layer;
a first diode comprising the second P− layer and the first N− layer; and
a second diode comprising the second N− layer and the first P− layer.

23. The package of claim 22, wherein the die comprises an internal electrostatic discharge (ESD) protection component configured to provide die level electrostatic discharge (ESD) protection, and wherein the internal electrostatic discharge (ESD) protection component and the first electrostatic discharge (ESD) protection component are configured to provide cumulative electrostatic discharge (ESD) protection for the package.

* * * * *